(12) United States Patent
Endo et al.

(10) Patent No.: US 7,095,112 B2
(45) Date of Patent: Aug. 22, 2006

(54) SEMICONDUCTOR DEVICE, SEMICONDUCTOR PACKAGE MEMBER, AND SEMICONDUCTOR DEVICE MANUFACTURING METHOD

(75) Inventors: Mitsuyoshi Endo, Yamato (JP); Mie Matsuo, Kamakura (JP); Chiaki Takubo, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 82 days.

(21) Appl. No.: 10/664,150

(22) Filed: Sep. 17, 2003

(65) Prior Publication Data
US 2004/0056341 A1 Mar. 25, 2004

(30) Foreign Application Priority Data
Sep. 19, 2002 (JP) .............................. 2002-272589

(51) Int. Cl.
*H01L 23/48* (2006.01)
*H05K 7/02* (2006.01)
*H01L 27/02* (2006.01)

(52) U.S. Cl. ...................... 257/724; 257/738; 257/777
(58) Field of Classification Search ................ 257/686, 257/698, 737, 738, 724; 361/141, 146
See application file for complete search history.

(56) References Cited

U.S. PATENT DOCUMENTS

| 4,670,770 | A | * | 6/1987 | Tai ............................... 257/777 |
| 4,945,399 | A | * | 7/1990 | Brown et al. ................ 257/698 |
| 6,166,937 | A | * | 12/2000 | Yamamura et al. ......... 363/141 |
| 6,362,525 | B1 | * | 3/2002 | Rahim ......................... 257/738 |
| 2003/0146463 | A1 | * | 8/2003 | Klee et al. ................... 257/303 |
| 2004/0238934 | A1 | * | 12/2004 | Warner et al. .............. 257/686 |

FOREIGN PATENT DOCUMENTS

| JP | 2002-110865 | 4/2002 |
| JP | 2003-007971 | 1/2003 |

* cited by examiner

*Primary Examiner*—David Nelms
*Assistant Examiner*—Dao H. Nguyen
(74) *Attorney, Agent, or Firm*—Finnegan, Henderson, Farabow, Garrett & Dunner, L.L.P.

(57) ABSTRACT

Provided a semiconductor device including: a wiring board; a semiconductor chip having a pad electrically connected to a wiring on the wiring board; a second semiconductor chip provided on the wiring board at a position facing a side of the semiconductor chip, having passive elements integrated therein, and having pads for external connection to which both ends of the passive elements are connected respectively and at least one of which is electrically connected to the wiring on the wiring board electrically connected to the pad of the semiconductor chip.

15 Claims, 23 Drawing Sheets

SEMICONDUCTOR DEVICE, SEMICONDUCTOR PACKAGE MEMBER, AND SEMICONDUCTOR DEVICE MANUFACTURING METHOD

CROSSREFERENCE TO RELATED APPLICATIONS

This application is based upon and claims the benefit of priority from the prior Japanese Patent Application No. 2002-272589 filed on Sep. 19, 2002; the entire contents of which are incorporated herein by reference.

BACKGROUND

1. Field of the Invention

The present invention relates to a semiconductor device including semiconductor chips and members that draw out electrical leads from the semiconductor chips, a semiconductor package member used for such a semiconductor device, and a manufacturing method of such a semiconductor device, and more particularly, to the semiconductor device, the semiconductor package member, and the semiconductor device manufacturing method that are suitable for a high-frequency (high-speed) circuit.

2. Description of the Related Art

In recent years, there has been a demand for a higher-frequency, higher-speed operation in a band of several GHz or higher in electronic equipment, communication equipment, and so on. In order to guarantee the operation performance of semiconductor devices used in electronic equipment and communication equipment in such a frequency band, it is naturally necessary to ensure the high-frequency, high-speed operability of semiconductor chips themselves, but it is also necessary to improve passive parts which are connected to the semiconductor chips for use and to improve a connecting method thereof.

First, a semiconductor device having bypass capacitors mounted/connected therein as passive parts will be explained as an example. FIG. 21A and FIG. 21B are views showing a structure example of such a semiconductor device in a prior art. FIG. 21A is a side view thereof and FIG. 21B is a top view thereof. As shown in FIG. 21A and FIG. 21B, this semiconductor device is so structured that a semiconductor chip 302 is flipchip-mounted on a wiring board 301. Projected electrodes (bumps) 303 made of, for example, gold are formed on pads (not shown) of the semiconductor chip 302 in advance for use in the flipchip mounting. The projected electrodes 303 are bonded to mounting lands provided on the wiring board 301 by, for example, a bonding technique.

The reference numeral 304 denotes a sealing resin to shield and protect the bonded portions and so on from the atmosphere, and the reference numeral 306 denotes solder balls for use in mounting this semiconductor device on another wiring board or the like. The solder balls 306 are electrically connected to the projected electrodes 303 of the semiconductor chip 302 by wirings (not shown) provided on the wiring board 301 and wirings (not shown) passing therethrough. The reference numeral 305 denotes bypass capacitors mounted on the wiring board 301 (detailed later).

Another structure example of a conventional wiring board having inductors (surface-mounted inductors) connected/mounted thereon as passive parts is shown in FIG. 22. As shown in FIG. 22, a surface-mounted semiconductor device 312 (package product) and surface mounted inductors 314 are mounted adjacent to each other on a wiring board 311 in this example. They are mounted by, for example, the reflow of solder. The semiconductor device 312 and the inductors 314 are electrically connected to each other by wirings 313 on the wiring board 311.

Especially when the semiconductor chip 302 in the semiconductor device shown in FIG. 21A and FIG. 21B is a logic integrated circuit or a memory, a transient electric current flows through power supply lines (not shown) due to input/output or internal switching. Especially when the switching operations are performed synchronously in a large number of the input/output lines or when a high-speed (high-frequency) operation is performed, the energy of the transient electric current becomes considerably large. The occurrence of a transient electric current generally causes the occurrence of fluctuation in a supplied voltage near the semiconductor chip 302 due to the impedance that the patterns of the power supply lines and the ground (not shown) have, which further causes an adverse effect of the malfunction of the semiconductor chip 302 itself.

Therefore, in order to eliminate such an adverse effect, bypass capacitors 305 are provided between the power supply lines and the grounds near the semiconductor chip 302, as shown in FIG. 21A and FIG. 21B, to prevent the electric current fluctuation at the upstream-side power supply lines which are supply sources of the transient electric current and at the grounds.

It is more preferable that the bypass capacitors 305 are disposed nearer to power supply terminals (pads) and ground terminals (pads) of the semiconductor chip 302 as is apparent from the abovementioned reason for preventing the voltage fluctuation (to further comment, this arrangement is even more preferable since wiring patterns and so on in a high-frequency, high-speed circuit are not simple leads but have impedance), but the arrangement thereof seldom comes near to such ideal state in actual practice due to the limited mounting space. For example, in the case shown in FIG. 21A and FIG. 21B, the bypass capacitors 305 are of a surface-mounted type and are disposed on a semiconductor device side of the wiring board 301, but they are arranged on corners (four corners) thereof.

One reason for such arrangement is that, though the arrangement pitch of input/output portions (pads) of the semiconductor chip 302 can be, for example, about 80 μm and wiring patterns on the wiring board 301 are accordingly formed, the interval between both terminals of the bypass capacitor 305 is 1 mm order at smallest and therefore, a mounting space which is accordingly large is required for forming wiring patterns for the bypass capacitor 305.

Therefore, minimizing the impedance of the power supply lines and the grounds is practically only way to prevent the occurrence of the aforesaid adverse effect when the mounting positions of the bypass capacitors 305 are thus limited. An adoptable method of reducing the impedance of the power supply lines and the grounds is, for example, such that the power supply terminals (pads) and the ground terminals (pads) of the semiconductor chip 302 are both provided in large numbers, and the wiring patterns are formed on the wiring board 301 so as to correspond to a large number of the power supply terminals and the ground terminals.

This method is disadvantageous in that the semiconductor chip 302 becomes large in size since a large number of the terminals are provided therein, and that it becomes necessary to further narrow the pitch of the pads and to further narrow the pitch of the connection with the wiring board 301 since a larger number of the terminals are provided in the same area. Therefore, there is a limit to the use of the semiconductor device as shown in FIG. 21A and FIG. 21B for the higher-frequency and higher-speed operation.

Further, the following can be said with respect to the board mounting structure shown in FIG. 22, which is used, for example, for a high-frequency VCO (voltage controlled oscillator) circuit. Incidentally, it is assumed here that the semiconductor device 312, which is constituted of an integrated chip of, for example, an NMOS type, is so structured that a pair of MOS transistors are feedback-connected therein to constitute an astable multivibrator, and electric currents between sources and drains of the MOS transistors are supplied from the outside via the inductors 314.

When the use of thus structured VCO is attempted in a high-frequency band of a GHz order, the involvement of parasitic elements is prominent in the wiring patterns 313 and the inductors 314, which influences the quality of oscillation output (level of phase modulation noise). This is because, for example, electromagnetic coupling or induction is caused by the parasitic elements. Therefore, there is also a limit to the use of the board mounting structure as shown in FIG. 22 for the higher-frequency, higher-speed operation.

As discussed above, under the present situation, the use of a semiconductor device mounted together with passive parts has a problem when the higher frequency operation is to be realized. The present invention is made in consideration of the above circumstances, and the object thereof is to provide a semiconductor device having semiconductor chips and members to draw out electrical leads from the semiconductor chips, a semiconductor package member used in such a semiconductor device, and a manufacturing method of such a semiconductor device that are usable at a higher frequency and a higher speed.

SUMMARY

A semiconductor device according to an aspect of the present invention includes: a wiring board; a semiconductor chip provided on the wiring board and having a pad electrically connected to a wiring on the wiring board; and a second semiconductor chip provided on the wiring board at a position facing a side of the semiconductor chip, having passive elements integrated therein, and having pads for external connection to which both ends of the passive elements are connected respectively and at least one of which is electrically connected to the wiring on the wiring board electrically connected to the pad of the semiconductor chip.

A semiconductor device according to another aspect of the present invention includes a plurality of semiconductor device portion units arranged in a lamination direction and each including: a wiring board; a semiconductor chip provided on the wiring board and having a pad electrically connected to a wiring on the wiring board; and a second semiconductor chip provided on the wiring board at a position facing a side of the semiconductor chip, having passive elements integrated therein, and having pads for external connection to which both ends of the passive elements are connected respectively and at least one of which is electrically connected to the wiring on the wiring board electrically connected to the pad of the semiconductor chip; and a vertical wiring portion passing through the wiring boards of the plural semiconductor device portion units and electrically connecting the wiring boards to one another.

A semiconductor package member according to an aspect of the present invention includes: a wiring board on which a semiconductor chip is mountable; and an auxiliary semiconductor chip provided on the wiring board at a position facing a side of the semiconductor chip to be mounted, having passive elements integrated therein, and having pads for external connection to which both ends of the passive elements are connected respectively and which are electrically connected to a wiring on the wiring board.

A semiconductor device manufacturing method according to an aspect of the present invention includes: mounting a semiconductor chip having a pad on a wiring board so as to electrically connect the pad and a wiring on the wiring board; and mounting a second semiconductor chip having passive elements integrated therein and having pads for external connection to which both ends of the passive elements are connected respectively, on the wiring board at a position facing a side of the semiconductor chip so as to electrically connect at least one of the pads for external connection to the wiring on the wiring board electrically connected to the pad of the semiconductor chip.

BRIEF DESCRIPTION OF THE DRAWINGS

The present invention will be described with reference to the drawings. These drawings are provided only for the illustrative purpose and in no respect, are intended to limit the present invention.

DETAILED DESCRIPTION

Explanation on Embodiments

Figure 1A:
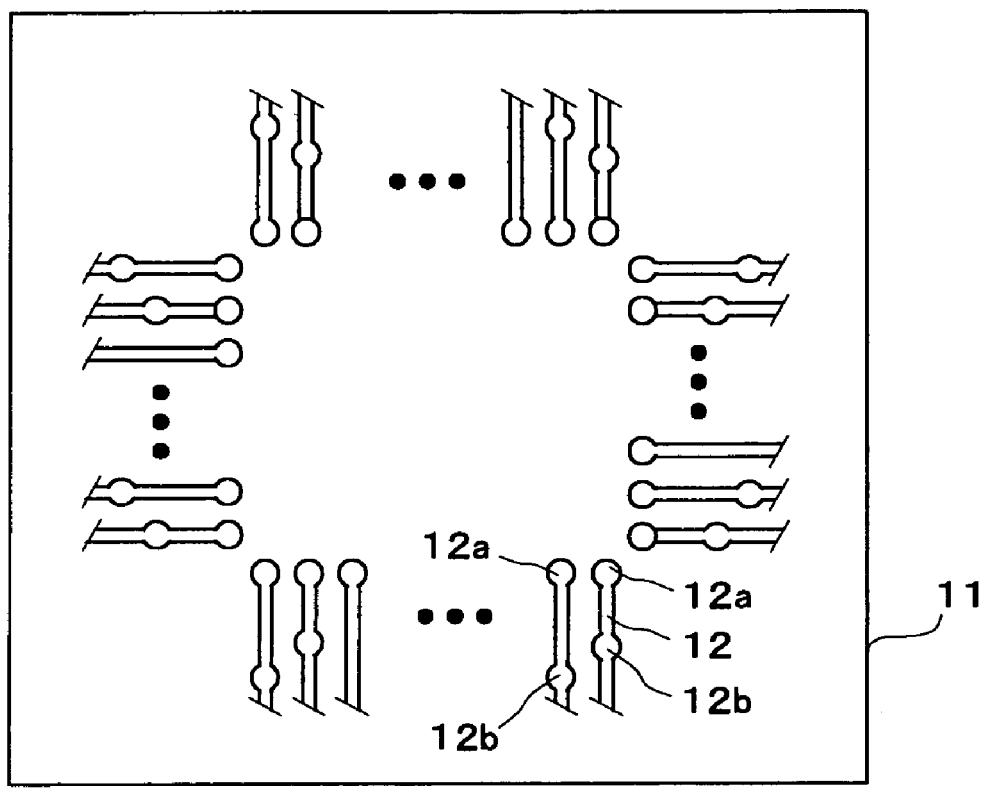
FIG. 1A and FIG. 1B are views showing a manufacturing process of a semiconductor device according to an embodiment of the present invention.

In a semiconductor device according to an aspect of the present invention, passive elements are integrated in a second semiconductor chip, and both ends of the passive elements are connected to pads for external connection respectively. A semiconductor chip and the second semiconductor chip are common in that they are semiconductor chips and the arrangement pitches of pads (pads for external connection) provided thereon can be at least substantially the same order.

Therefore, it is possible to dispose the second semiconductor chip adjacent to a position facing a side of the semiconductor chip. As a result, the passive elements integrated in the second semiconductor chip are positioned very close to the semiconductor chip, which makes it possible to eliminate a factor obstructing a high-frequency operation. Here, examples usable as a wiring board are a resin substrate such as glass epoxy resin and a ceramic substrate such as alumina.

As a form of an embodiment, the passive elements integrated in the second semiconductor chip are elements of one kind, or two kinds or more selected from a group of capacitors, resistors, and inductors. They can be utilized as, for example, bypass capacitors in the case of capacitors, antireflective elements in the case of resistors, and load elements of a VCO in the case of inductors. These passive elements can be connected in parallel between pads of the semiconductor chip or connected in series from the pads of the semiconductor chip.

Incidentally, as the bypass capacitors, those vertically stacked and using, for example, tantalum oxide as a dielectric are usable. This type of capacitors can ensure electrostatic capacitance of, for example, about 1 μF per 1 mm$^2$, which allows the bypass capacitors to function as bypass capacitors of a semiconductor chip as, for example, a high-speed logic element or memory with multiple pins excellent in good frequency characteristics. These forms apply both to a semiconductor device so structured that semiconductor device portion units are stacked therein and to a semiconductor package member having auxiliary semiconductor chips mounted thereon.

As another form of the embodiment, the semiconductor chip is flipchip-connected to the wiring board so as to electrically connect the pad to the wiring on the wiring board.

As still another form of the embodiment, the semiconductor chip has bonding wire connection to the wiring of the wiring board so as to electrically connect the pad to the wiring on the wiring board.

Either of the flipchip connection and the connection using a bonding wire may be used to connect the semiconductor chip to the wiring board. In any case, no influence is given to the proximity in the arrangement positions between the semiconductor chip and the second semiconductor chip.

As yet another form of the embodiment, the second semiconductor chip is flipchip-connected to the wiring board so as to electrically connect the pads for external connection to the wiring on the wiring board.

As yet another form of the embodiment, the second semiconductor chip has bonding wire connection to the wiring of the wiring board so as to electrically connect the pads for external connection to the wiring on the wiring board.

Either of the flipchip connection and the bonding wire connection may be also used to connect the second semiconductor chip to the wiring board. In any case, no influence is given to the proximity in the arrangement positions between the semiconductor chip and the second semiconductor chip.

As yet another form of the embodiment, the semiconductor chip and the second semiconductor chip are both 60 μm or less in thickness. A semiconductor chip and a second semiconductor chip are generally about several hundreds μm in thickness, but the thickness thereof can be reduced to 60 μm or less when the thickness is reduced as much as possible while their mechanical strength is kept. When they are thus thin, the size in a height direction as the semiconductor device is reduced. This makes it possible to obtain a highly functional semiconductor device whose total thickness is small especially when this form is applied to a semiconductor device of a third-dimensionally stacked type.

As yet another form of the embodiment, the second semiconductor chip has, besides the pads for external connection for use in the flipchip-connection to the wiring board, a pad for external connection not contributing to the flipchip connection to the wiring board. Such a second semiconductor chip can be manufactured as a general-purpose product. Specifically, a plurality of, for example, capacitors are integrated in advance, and only necessary ones (terminals (pads) used as terminals of the capacitors or the like) thereamong are used for the flipchip connection.

A semiconductor device according to another aspect of the present invention is so structured that a plurality of the above-described semiconductor devices are arranged in a lamination direction and a vertical wiring portion serves as a wiring passing through the semiconductor devices. Even with such a stacked structure, a three-dimensional semiconductor device with sufficiently smaller height compared with that in a prior art is obtainable. This is because conventional surface-mounted passive parts become unnecessary, so that the size of the semiconductor device is reduced also in the height direction.

A semiconductor package member according to an aspect of the present invention is so structured that a semiconductor chip is not mounted thereon and only an auxiliary semiconductor chip in which passive elements are integrated are mounted on a wiring board in advance. When a semiconductor chip is mounted, a packaged semiconductor chip can be fabricated. Also in this case, a factor obstructing a high-frequency operation is eliminated.

A semiconductor device manufacturing method according to an aspect of the present invention is a method enabling the manufacture of the above-described semiconductor devices. Incidentally, either of the mounting of the semiconductor chip and the mounting of the second semiconductor chip may come first.

Hereinafter, embodiments of the present invention will be explained with reference to the drawings based on the foregoing description. FIG. 1A and FIG. 1B to FIG. 6 are views showing manufacturing processes of a semiconductor device according to an embodiment of the present invention. FIGS. 1A, 2A, 3A, 4A, and 5A are plane views thereof, and FIGS. 1B, 2B, 3B, 4B, 5B, and FIG. 6 are front views thereof. In these drawings, the same reference numerals and symbols are used to designate the same and corresponding portions.

Figure 1B:
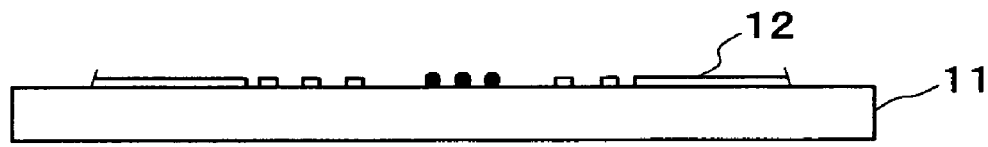

First, as shown in FIG. 1A and FIG. 1B, necessary wiring patterns 12 are formed on a wiring board 11. The wiring patterns 12 include lands 12a for use in flipchip-mounting a semiconductor chip and lands 12b for use in flipchip-mounting auxiliary semiconductor chips (in the following explanation, the auxiliary semiconductor chips are assumed to be chips having capacitors integrated therein). Besides, the wiring patterns 12 are also connected to inter-wiring-layer connectors (not shown) for realizing electrical conduction in a direction passing through the wiring board 11.

In this case, a large number of the lands 12a for use in flipchip-mounting the semiconductor chip are arranged in a square shape at positions corresponding to positions of projected electrodes formed on the semiconductor chip. The total number thereof is, for example, about 200 to about 1000. The arrangement pitch thereof is, for example, 60 μm to 100 μm. The size of the wiring board 11 is, for example, 10 mm square to 25 mm square. The thickness of the wiring patterns 12 is, for example, 30 μm to 50 μm. The aforesaid materials are usable for the wiring board 11.

The lands 12b for use in flipchip-mounting the capacitor chips are arranged very close to the lands 12a for use in flipchip-mounting the semiconductor chip (at positions very close to the lands 12a but not causing mutual interference when these chips are mounted). This embodiment shows the case where at least two terminals (pads) on both ends of each side of the semiconductor chip are a power supply terminal and a ground terminal, but the power supply terminals and the ground terminals may be arranged in different manners.

Figure 2A:
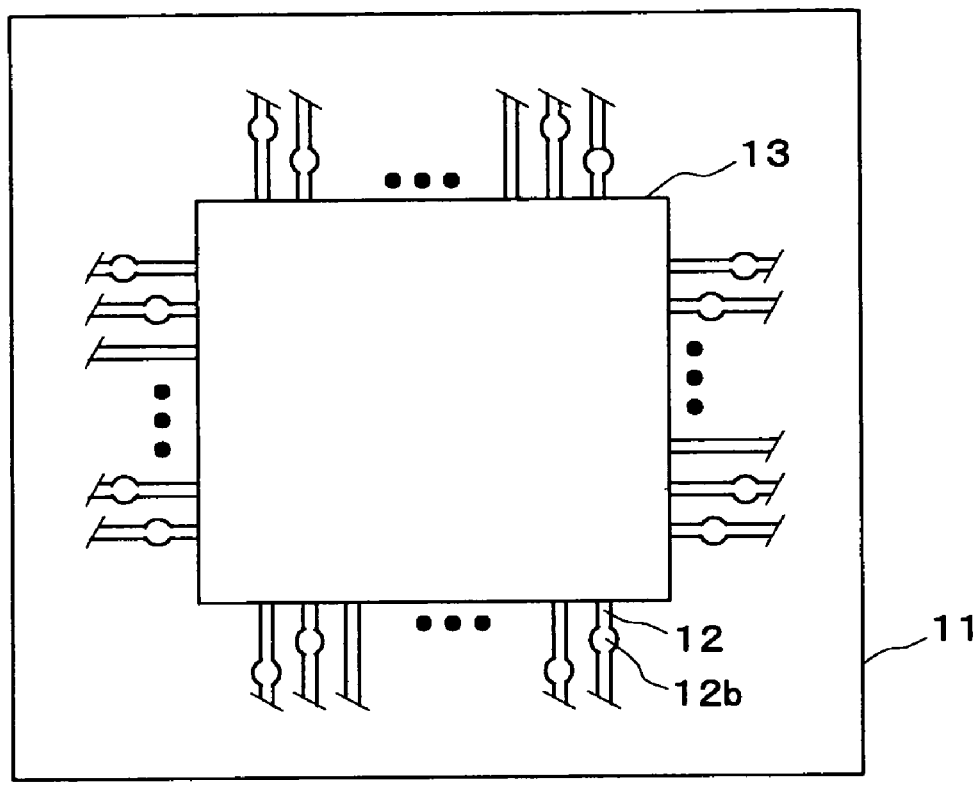
FIG. 2A and FIG. 2B are views subsequent to FIG. 1A and FIG. 1B, showing a manufacturing process of the semiconductor device according to the embodiment of the present invention.
Figure 2B:
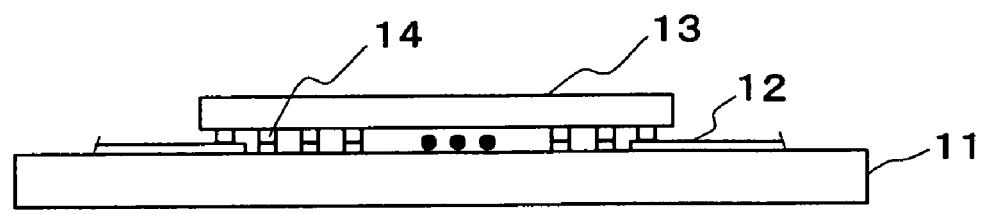

Next, as shown in FIG. 2A and FIG. 2B, a semiconductor chip 13 is flipchip-mounted on the wiring board 11. The size of the semiconductor chip 13 is, for example, 5 mm square to 20 mm square. The semiconductor chip 13 has gold projected electrodes (bumps) 14 formed in advance on terminals (pads) thereon for use in flipchip-mounting the semiconductor chip 13. The projected electrodes 14 can be formed in such a manner that, for example, gold wires are connected onto the pads by bonding using a wire bonding tool and are cut near roots of the connection.

The semiconductor chip 13 having the projected electrodes 14 formed thereon is bonded onto the wiring board 11 after being aligned with the lands 12a on the wiring board 11. For example, a flipchip bonding tool capable of giving a pressure onto and heating a rear face of the semiconductor chip 13 can be used for this bonding. An ultrasonic wave may be utilized for giving a pressure thereto.

Figure 3A:
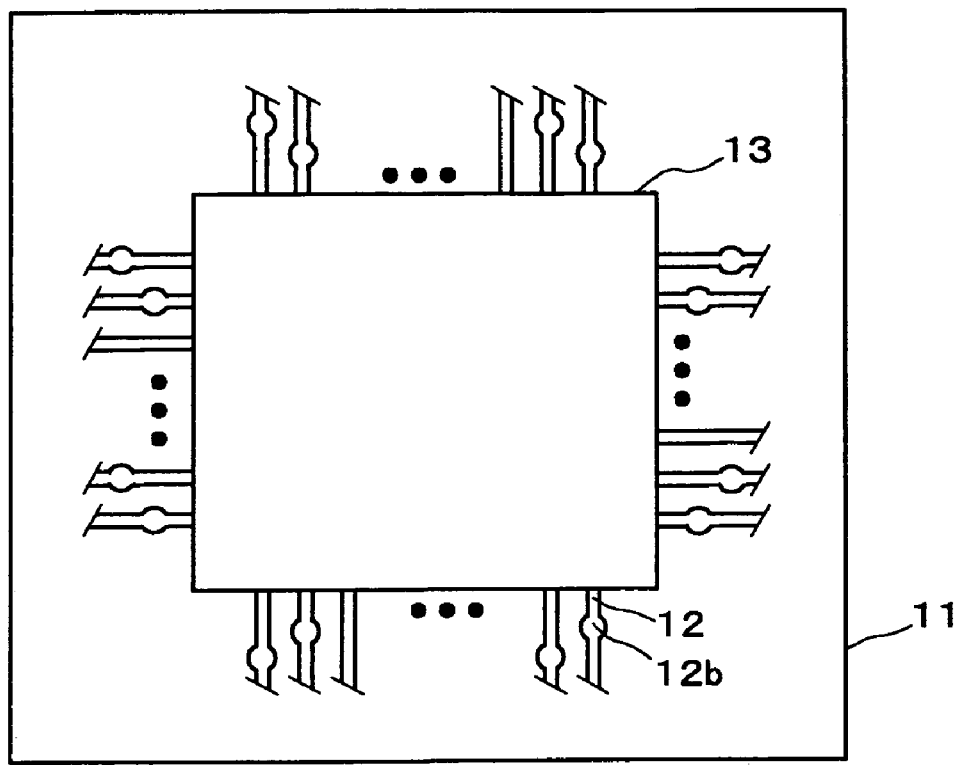
FIG. 3A and FIG. 3B are views subsequent to FIG. 2A and FIG. 2B, showing a manufacturing process of the semiconductor device according to the embodiment of the present invention.
Figure 3B:
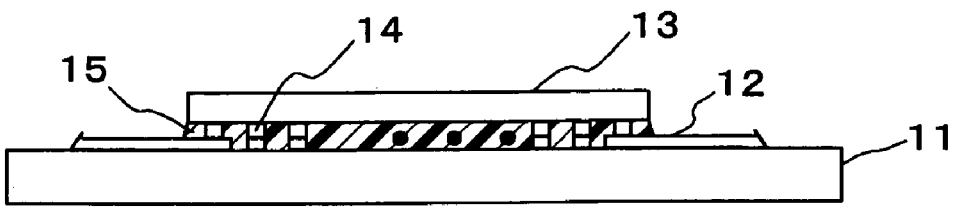

Next, as shown in FIG. 3A and FIG. 3B, a gap between the wiring board 11 and the semiconductor chip 13 is filled with an underfill resin 15 in order to shield and protect bonded portions from the atmosphere. A capillary action through the use of the underfill resin 15 in liquid form can be utilized for filling the gap. After the gap is filled, the underfill resin 15 is cured by, for example, heating.

Figure 4A:
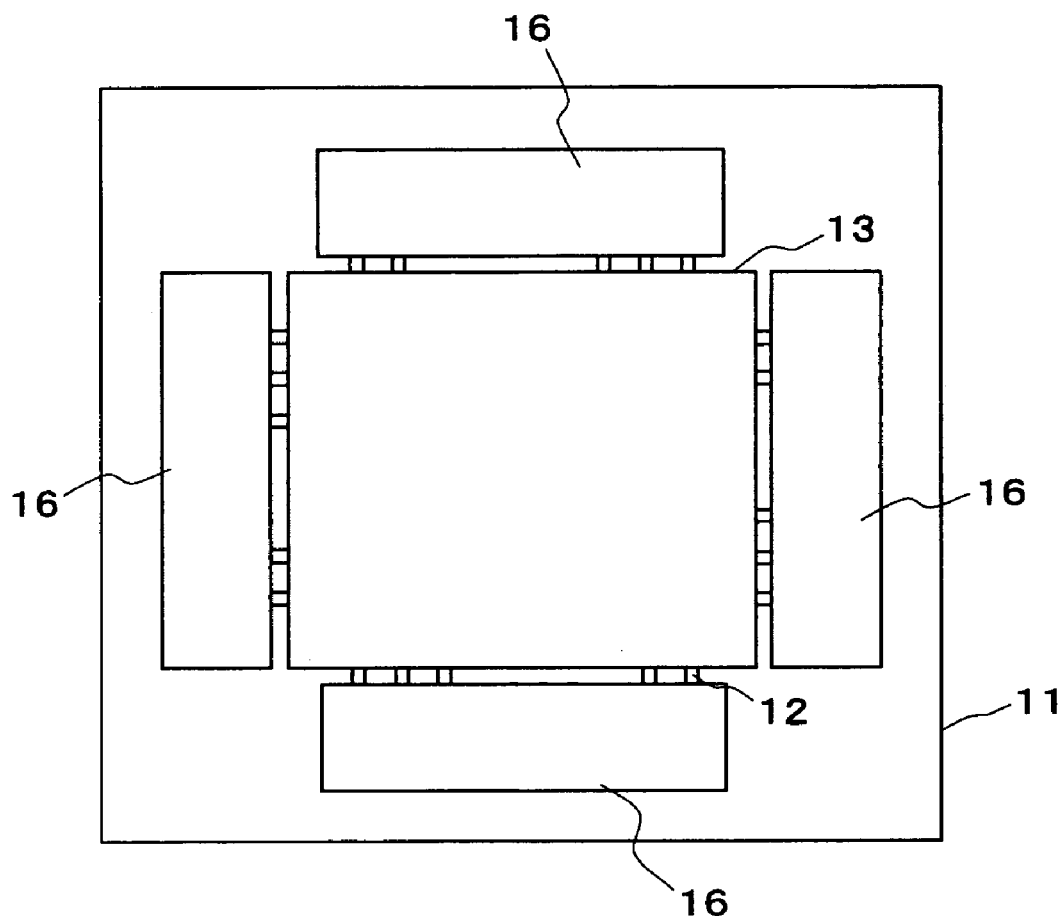
FIG. 4A and FIG. 4B are views subsequent to FIG. 3A and FIG. 3B, showing a manufacturing process of the semiconductor device according to the embodiment of the present invention.
Figure 4B:
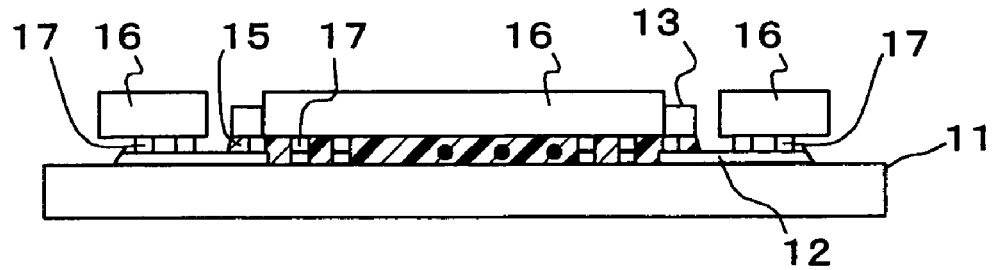

Next, as shown in FIG. 4A and FIG. 4B, capacitor chips 16 are flipchip-mounted adjacent to respective sides of the semiconductor chip 13. The capacitor chips 16 have gold projected electrodes 17 formed in advance on terminals (pads) thereon for use in flipchip-mounting the capacitor chips 16. The projected electrodes 17 can be formed in the same manner as in the formation of the projected electrodes 14 on the semiconductor chip 13.

There may be some cases where it is not necessary to form the projected electrodes 17 on all the pads on the capacitor chips 16. Specifically, as for the capacitor chips 16, a large number of two-terminal capacitors are integrated/formed therein and pads are prepared as respective terminals thereof. The projected electrodes 17 are formed only on pads, among the prepared pads, actually used as the capacitors so as to match the arrangement of the power supply terminals and the ground terminals of the semiconductor chip 13. In this way, it becomes possible to supply and utilize the capacitor chips 16 as general-purpose products.

Needless to say, the capacitor chips 16 whose pads are prepared exclusively for the specific semiconductor chip 13 may be used. Further, each of the capacitor chips 16 may be the one in which a single two-terminal capacitor is formed, but in this case, the chip size may possibly become so small that it is not appropriate for the flipchip connection. In such a case, such a structure is advantageous in handling that the single capacitor chip 16 has the plural two-terminal capacitors integrated therein as described above.

The capacitor chips 16 are larger in height than the semiconductor chip 13 in this embodiment. Therefore, it is advantageous under such a condition that the semiconductor chip 13 is flipchip-mounted first and the capacitor chips 16 are flipchip-mounted thereafter. This is because the flipchip bonding tool for the semiconductor chip 13 can be also used for the capacitor chips 16, which reduces production facility cost. In this case, even when the flipchip bonding tool is used in common, the flipchip bonding tool is not interfered by the semiconductor chip 13 at the time when the capacitor chips 16 are flipchip-connected.

The capacitor chips 16 having the projected electrodes 17 formed thereon are bonded onto the wiring board 11 after being aligned with the lands 12b on the wiring board 11. The same method can be used for this bonding as that for the flipchip connection of the semiconductor chip 13.

Figure 5A:
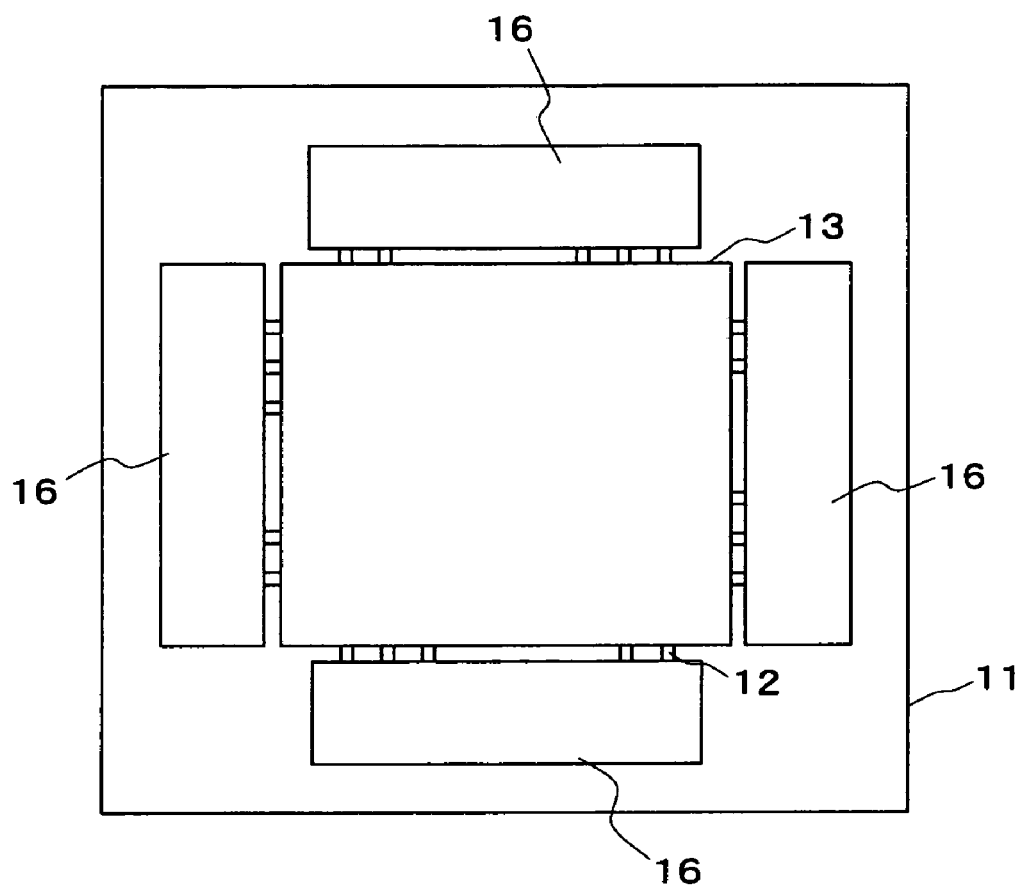
FIG. 5A and FIG. 5B are views subsequent to FIG. 4A and FIG. 4B, showing a manufacturing process of the semiconductor device according to the embodiment of the present invention.
Figure 5B:
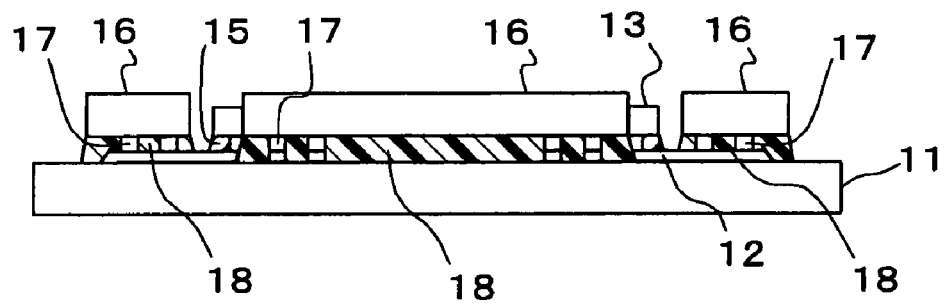

Next, as shown in FIG. 5A and FIG. 5B, a gap between the wiring board 11 and the capacitor chips 16 is filled with an underfill resin 18 in order to shield and protect the bonded portions from the atmosphere. A capillary action through the use of the underfill resin 18 in liquid form can be utilized for filling the gap. After the gap is filled, the underfill resin 18 is cured by, for example, heating.

Figure 6:
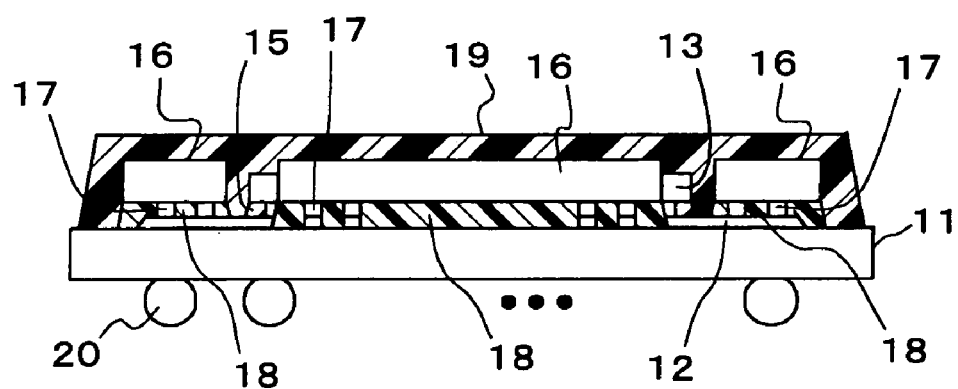
FIG. 6 is a view subsequent to FIG. 5A and FIG. 5B, showing a manufacturing process of the semiconductor device according to the embodiment of the present invention.

Next, as shown in FIG. 6, a resin mold 19 is formed by, for example, transfer mold so as to cover the semiconductor chip 13 and the capacitor chips 16 for the protection thereof, and solder balls 20 for external connection are attached on a rear face side of the wiring board 11. Through these processes, the semiconductor device of this embodiment is obtainable.

As described above, in the semiconductor device according to this embodiment, the capacitors are integrated in each of the capacitor chips 16, and both ends of the capacitors are connected to the pads for external connection respectively. The semiconductor chip 13 and the capacitor chips 16 are the same in that they are semiconductor chips, and the arrangement pitches of the pads (pads for external connection) provided thereon can be at least substantially the same order. Therefore, it is possible to dispose the capacitor chips 16 adjacent to the positions facing the sides of the semiconductor chip 13. As a result, the capacitors integrated in the capacitor chips 16 can function as bypass capacitors at positions very close to the semiconductor chip 13.

With the above-described structure, surface-mounted capacitors of a conventional type become unnecessary, nor is it necessary to provide a large number of the power supply terminals (pads) or the ground terminals (pads) on the semiconductor chip 13 in order to reduce an electric current per terminal. Therefore, a high-frequency semiconductor device can be realized without any problem. Further, since the semiconductor chip 13 is flipchip-connected first, such an effect is brought about that the state after the connection is easily confirmed, which is suitable especially when the semiconductor chip 13 has many terminals to make the connection even more difficult.

The underfill resin 15 under the semiconductor chip 13 is filled immediately after the flipchip-connection thereof in the above-described embodiment, but the underfill resin 15 and the underfill resin 18 may be filled and cured collectively after the capacitor chips 16 are flipchip-connected. Alternatively, it is also possible to fill only the underfill resin 15 under the semiconductor chip 13 immediately after the flipchip connection thereof and to cure the underfill resin 15 and the underfill resin 18 collectively after the capacitor chips 16 are flipchip-connected. In both of the cases, the curing time is saved.

Figure 7:
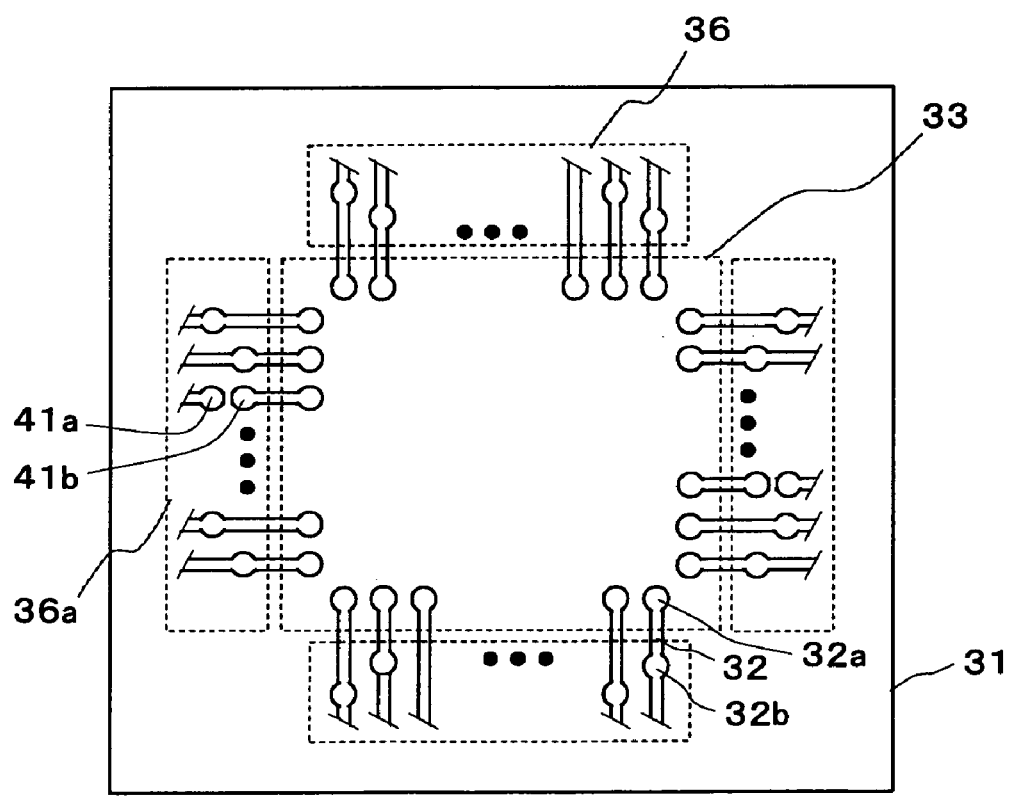
FIG. 7 is a plane view explaining a semiconductor device according to another embodiment of the present invention.

Next, another embodiment of the present invention will be explained with reference to FIG. 7. FIG. 7 is a plane view explaining a semiconductor device according to the other embodiment of the present invention.

As shown in FIG. 7, this semiconductor device is substantially the same as that in the above-described embodiment in that wiring patterns 32 are disposed on a wiring board 31, and that the wiring patterns 32 have lands 32a for use in flipchip-connecting a semiconductor chip 33 and lands 32b for use in flipchip-connecting auxiliary semiconductor chips 36. This embodiment is also the same as the above-described embodiment in that the wiring patterns 32 are also connected to inter-wiring-layer connectors (not shown) for electrical conduction in a direction passing through the wiring board 31.

In this embodiment, the wiring patterns 32 further include lands 41a, 41b for having elements inserted in series into wirings which extend to (from) terminals (pads) of the semiconductor chip 33. Accordingly, when the auxiliary semiconductor chips 36a, which have resistors besides capacitors integrated therein, are flipchip-mounted on the wiring board 31, the resistors are connected between the lands 41a and the lands 41b. Such resistors are inserted into signal lines to attenuate signals, so that the reflection can be prevented. This structure is useful when the semiconductor chip 33 is a logic element or a memory.

Thus, in this embodiment, the capacitors are not simply integrated in the auxiliary semiconductor chips 36a, but other elements are integrated therein to realize multifunction. Various forms of such multifunction are possible depending on the kinds of the semiconductor chip 33. For example, when the semiconductor chip 33 includes an A/D converter or a D/A converter, signals inputted/outputted thereto/therefrom may possibly be analog signals. In this case, elements necessary for analog signal processing, for example, filters or the like may be integrated.

Figure 8:
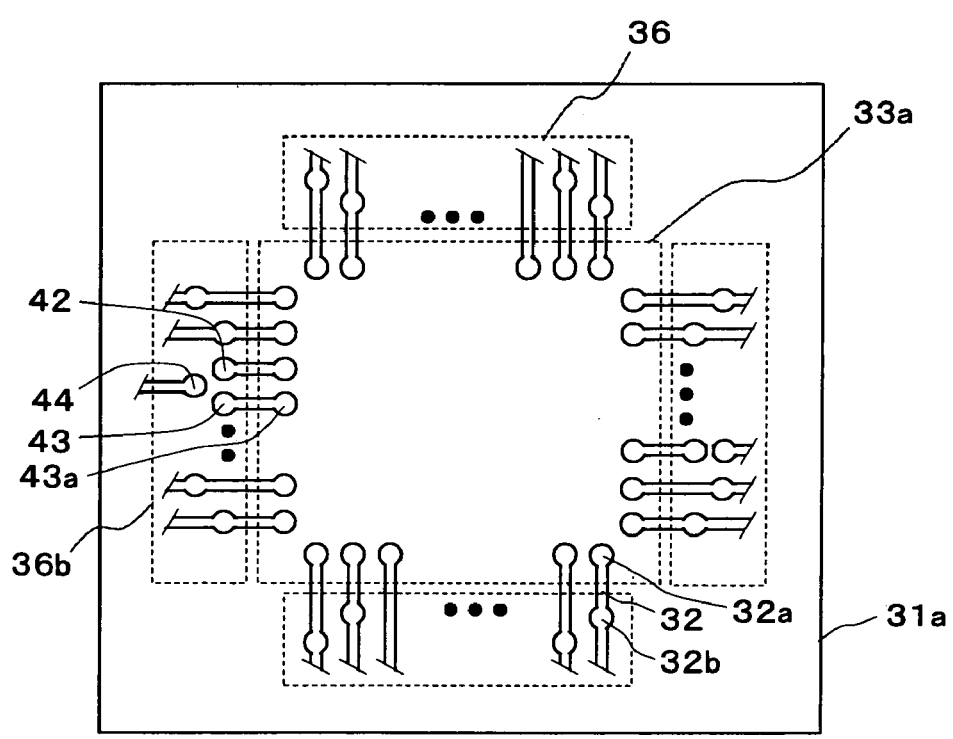
FIG. 8 is a plane view explaining a semiconductor device according to still another embodiment of the present invention.

Next, still another embodiment of the present invention will be explained with reference to FIG. 8. FIG. 8 is a plane view explaining a semiconductor device according to the still another embodiment of the present invention. The case when inductors are also integrated in auxiliary semiconductor chips will be explained in this embodiment.

As shown in FIG. 8, this semiconductor device is the same as those in the above-described embodiments in that wiring patterns 32 are provided on a wiring board 31a and the wiring patterns 32 have lands 32a for use in flipchip-connecting a semiconductor chip 33a and lands 32b for use in flipchip-connecting auxiliary semiconductor chips 36. This embodiment is also the same as the above-described embodiments in that the wiring patterns 32 are also connected to inter-wiring-layer connectors (not shown) for electrical conduction in a direction passing through the wiring board 31a.

In this embodiment, the wiring patterns 32 further include lands 42, 43, 44 for having passive elements (inductors) inserted in series into wirings which extend to (from) terminals (pads) of the semiconductor chip 33a. The inductors are integrated on the auxiliary semiconductor chips 36b besides capacitors in such an arrangement that an inductor is to be connected between the lands 42, 44 and another inductor is to be connected also between the lands 43, 44. When the auxiliary semiconductor chips 36b are flipchip-mounted on the wiring board 31a, this connection state is obtained, and here, the distance of pattern wirings between the inductor-side lands 43 and the lands 43a on a semiconductor chip 33a side can be made very short (the same applies to the lands 42), which is advantageous in circuit operation.

Figure 9A:
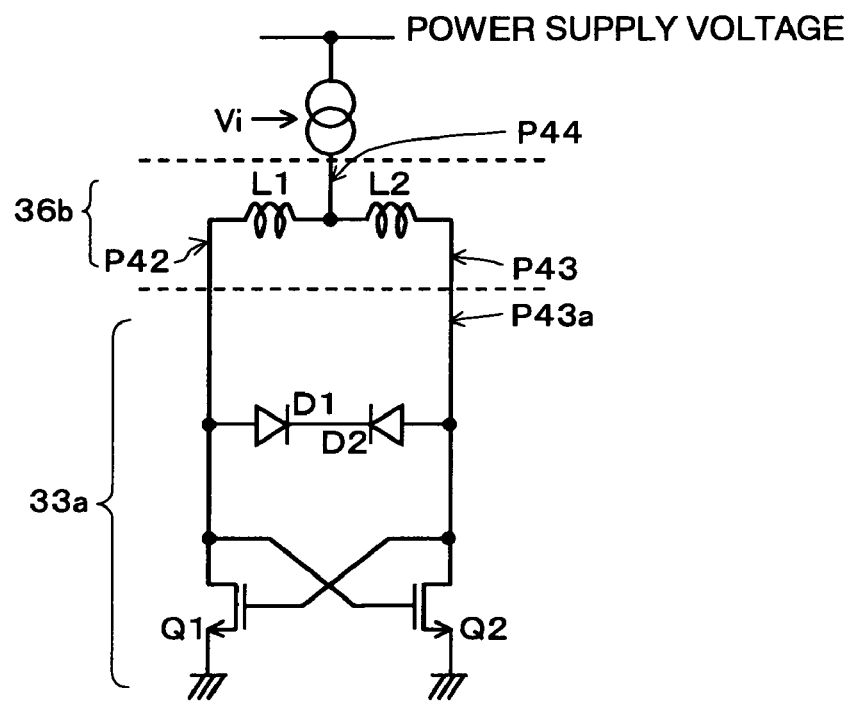
FIG. 9A is a circuit diagram showing an example of a connection relationship between a semiconductor chip 33a and an auxiliary semiconductor chip 36b shown in FIG. 8.
Figure 9B:
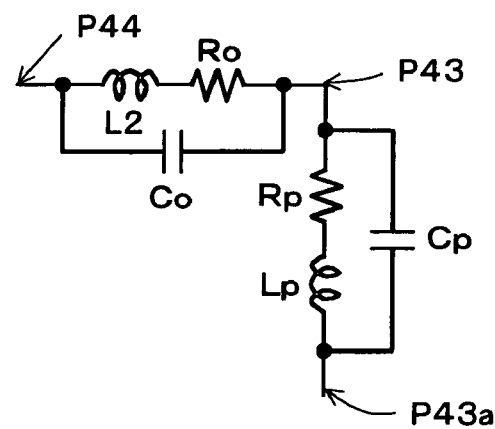
FIG. 9B is a circuit diagram showing a part thereof as an equivalent circuit.

This will be explained below with reference to FIG. 9A and FIG. 9B. FIG. 9A and FIG. 9B are a circuit diagram showing an example of a connection relationship between the semiconductor chip 33a and the auxiliary semiconductor chip 36b (FIG. 9A) and a circuit diagram showing a part thereof as an equivalent circuit (FIG. 9B). As shown in FIG. 9A, the semiconductor chip 33a and the auxiliary semiconductor chip 36b are connected to constitute a VCO.

To explain the connection as the circuit, in the semiconductor chip 33a, NMOS transistors Q1, Q2 grounded at sources are feedback-connected to each other, and to drain sides thereof, anode sides of both diodes D1, D2 which are connected at a common cathode thereof are connected respectively. Further, drain sides of the NMOS transistors Q1, Q2 extend to the outside from the semiconductor chip 33a and are connected to the auxiliary semiconductor chip 36b by pattern wirings.

In the auxiliary semiconductor chip 36b, inductors L1, L2 are integrated, and one end of each of the inductors L1, L2 is connected to each of the aforesaid drain sides. The other ends of the inductors L1, L2 are made common and the common end extends to the outside of the auxiliary semiconductor chip 36b to be connected to one end of a current source (a voltage controlled current source). The other end of the current source is connected to a power supply voltage and controlled by a voltage Vi. Note that P42, P43, P43a, P44 shown in FIG. 9A correspond to the reference symbols 42, 43, 43a, 44 in FIG. 8 respectively.

In the VCO having the above-described connection structure, it is required more that the inductors L1, L2 should function as ideal inductances as the operation frequency becomes higher. This will be explained using FIG. 9B.

FIG. 9B shows the inductor L2 shown in FIG. 9A and pattern wirings (P43 side) connected thereto as an equivalent circuit (P44, P43, P43a denote the same as in FIG. 9A). As shown in FIG. 9B, in the inductor L2, there generally exist a series resistor R0 and a parallel capacitance C0 as parasitic elements. Further, in a pattern wiring between P43 and P43a, there generally exist a series inductance Lp, a series resistor Rp, and a parallel capacitance Cp. The influence of these parasitic elements, even though at very small values, becomes more significant as the frequency becomes higher. This is because, for example, electromagnetic coupling or induction occurs to increase a phase modulation noise as oscillation output of the VCO.

Figure 10:
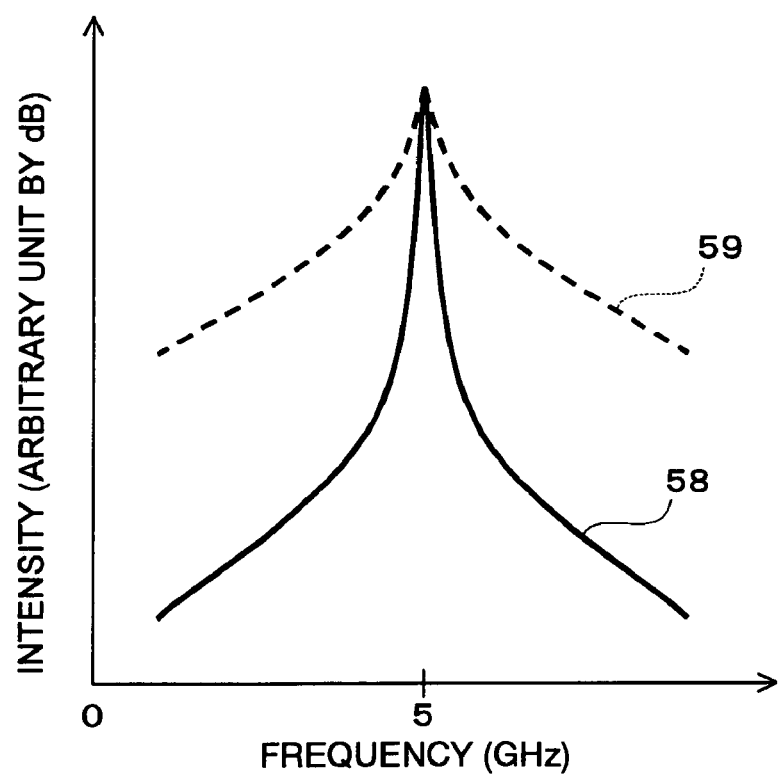
FIG. 10 is a chart showing an example of the measurement of the oscillation quality of a VCO having the structure shown in FIG. 9A and FIG. 9B.

FIG. 10 is a chart showing an example of the measurement of the oscillation quality of the VCO structured as shown in FIG. 9A and FIG. 9B. In FIG. 10, the reference numeral 58 shows the result of a spectrum analysis of an oscillated waveform in the above-described embodiment, and it is seen that the level of the phase modulation noise is considerably low in the vicinity of the center frequency (5 GHz). In contrast, the reference numeral 59 shows an example of the measurement of oscillation quality when conventional surface-mounted inductors are used as the inductors L1, L2, and it is seen that the level of the phase modulation noise is high near the center frequency. This is thought to result from the occurrence of electromagnetic coupling or induction due to considerably large values as the parasitic elements as explained above.

As is seen from the above description, the use of the conventional surface-mounted inductors is eliminated and the auxiliary semiconductor chips 36, 36b are used instead in this embodiment, so that the semiconductor device can be made suitable for the high-frequency operation without causing any problem.

Figure 11A:
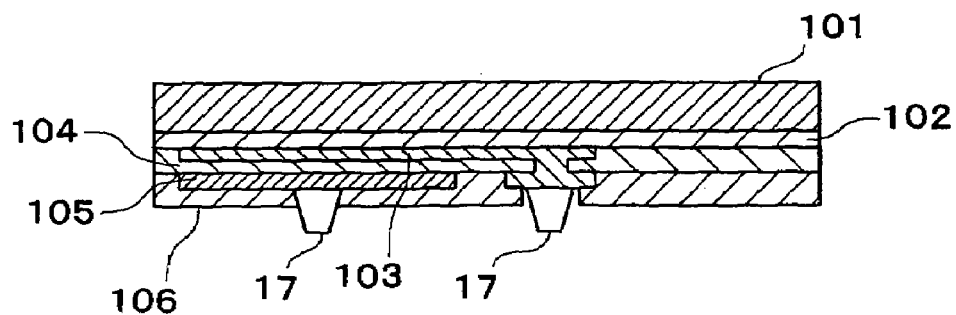
FIG. 11A, FIG. 11B, FIG. 11C, and FIG. 11D are enlarged views schematically showing sectional structures (or plane structures) of capacitor chips 16, 36 and auxiliary semiconductor chips 36a, 36b described in the aforesaid embodiments.
Figure 11B:
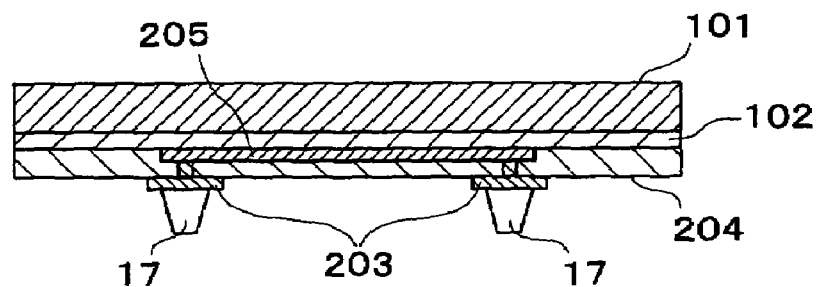
Figure 11C:
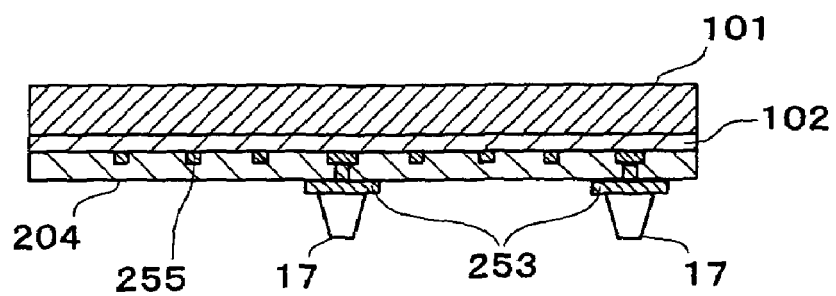
Figure 11D:
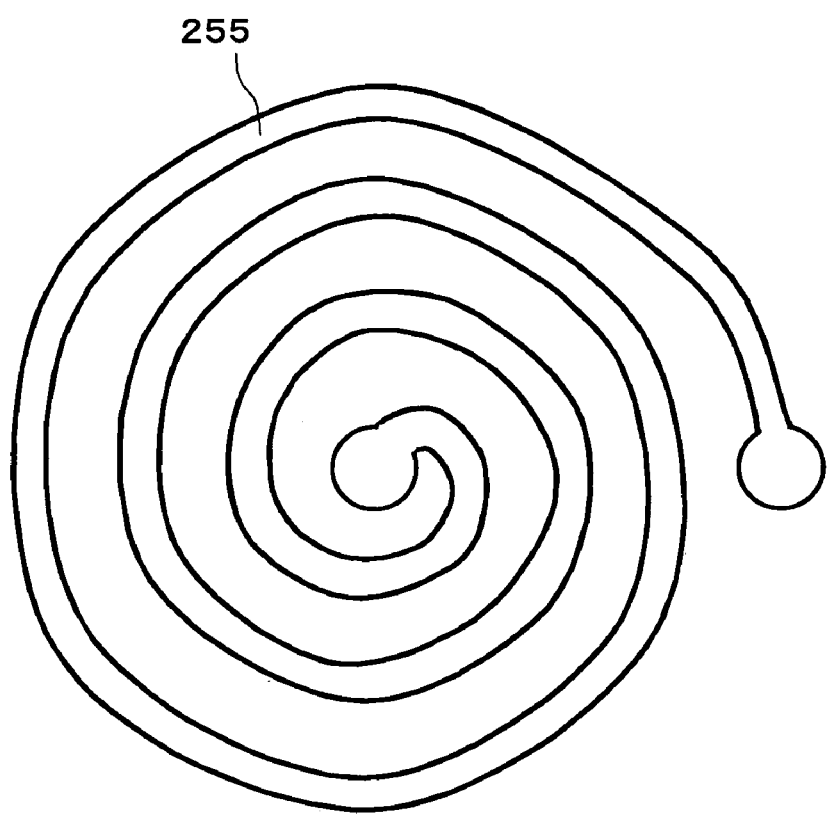

FIG. 11A, FIG. 11B, FIG. 11C, and FIG. 11D are enlarged views schematically showing sectional structure examples (or a plane structure example) of the capacitor chips 16, 36 and the auxiliary semiconductor chips 36a, 36b explained in the above-described embodiments. FIG. 11A shows the structure of capacitors, FIG. 11B shows the structure of resistors, and FIG. 11C and FIG. 11D show the structure of inductors.

As shown in FIG. 11A, the capacitors exist on an insulation layer 102 formed on a semiconductor substrate (for example, a silicon substrate) 101. Capacitor structures of a high-dielectric layer 104 sandwiched by a lower electrode layer 103 and an upper electrode layer 105 are formed on the insulation layer 102. The lower electrode layer 103 is connected to electric conductors passing through the high-dielectric layer 104, and the electric conductors conduct electricity to pads provided on the surface. The upper electrode layer 105 partly appears on the surface as pads as well. The exposed surface except these pads is covered and protected by an insulation layer 106.

As the high-dielectric layer 104, for example, tantalum oxide is usable. As the lower electrode layer 103 and the upper electrode layer 105, for example, aluminum is usable, and as the insulation layer 102, for example, silicon oxide is usable. By the structure with these materials, electrostatic capacitance of, for example, 1 µF per 1 mm$^2$ is obtainable. This capacitance is sufficient as a bypass capacitor.

As shown in FIG. 11B, the resistors also exist on the insulation layer 102 formed on the semiconductor substrate 101. A resistor layer 205 is formed on the insulation layer 102, both ends of the resistor layer 205 are connected to electric conductors passing through an insulation layer 204, and the electric conductors conduct electricity to electrodes 203 (pads) at both ends provided on the surface respectively. Such structure of the resistors is well-known in the art.

Further, as shown in FIG. 11C and FIG. 11D, the inductors also exist on the insulation layer 102 formed on the semiconductor substrate 101. Spiral electric conductors 255 are formed on the insulation layer 102, both ends of the electric conductors 255 are connected to electric conductors passing through the insulation layer 204, and these conductors conduct electricity to electrodes (pads) 253 at both ends existing on the surface, respectively.

Note that the reference numeral 17 in FIG. 11A, FIG. 11B, and FIG. 11C denotes the aforesaid projected electrodes, and after the above-described structures are completed as the auxiliary semiconductor chip, the projected electrodes 17 are formed on the pads thereof before the auxiliary semiconductor chip is flipchip-connected to the wiring board 11, 31, or 31a. The forming method thereof is as previously described.

Figure 12:
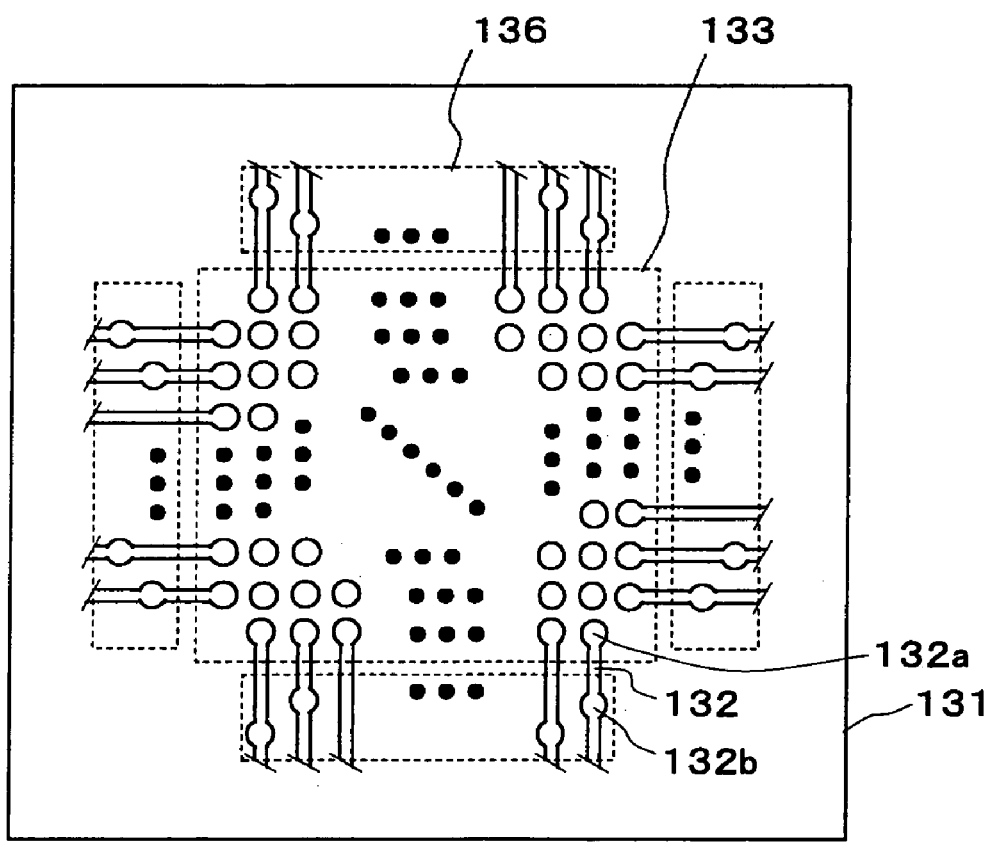
FIG. 12 is a plane view explaining a semiconductor device according to yet another embodiment of the present invention.

Next, yet another embodiment of the present invention will be explained with reference to FIG. 12. FIG. 12 is a plane view explaining the semiconductor device according to the yet another embodiment of the-present invention.

As shown in FIG. 12, this semiconductor device is substantially the same as those in the above-described embodiments in that wiring patterns 132 are provided on a wiring board 131 and the wiring patterns 132 have lands 132a for use in flipchip-connecting a semiconductor chip 133 and lands 132b for use in flipchip-connecting capacitor chips 136. Further, this embodiment is also the same as the above-described embodiments in that the wiring patterns 132 are also connected to inter-wiring-layer connectors (not shown) for electrical conduction in a direction passing through the wiring board 131.

This embodiment is so structured to be also applicable to the case when terminals (pads) of the semiconductor chip 133 are formed in a grid pattern. Accordingly, the wiring patterns 132 on the wiring board 131 are arranged so as to match the formation pattern of the terminals (pads) on the semiconductor chip 133. In the semiconductor chip 133 in which the terminals (pads) are formed in the grid pattern, it is possible to improve pad arrangement efficiency to reduce the area of the semiconductor chip. Note that the pitch of the grid is, for example, 100 µm to 150 µm.

Also in such a case, the same method previously explained can be used for the flipchip connection of the semiconductor chip 133 to the wiring board 131. Then, a part of terminals (pads) on the utmost outer periphery among the terminals (pads) constituting the grid are used as power source terminals and ground terminals, so that it is made possible to provide the capacitor chips 136 at positions facing the sides of the semiconductor chip 133 as shown in the drawing and to have the capacitors which are integrated in the capacitor chips 136 function as bypass capacitors at positions very close to the semiconductor chip 133. Even when terminals (pads) not positioned on the utmost outer periphery among the terminals (pads) constituting the grid are the power source terminals and the ground terminals, they can also function as good bypass capacitors, even though the wiring patterns 132 become somewhat longer since the patterns have to extend to the inner portion.

Similarly, a semiconductor device suitable for the high-frequency operation is obtainable when passive elements of one kind, or two kinds or more selected from capacitors, resistors, inductors, and so on are integrated in the auxiliary semiconductor chips 136.

Next, yet another embodiment of the present invention will be explained with reference to FIG. 13A and FIG. 13B to FIG. 17. FIG. 13A and FIG. 13B to FIG. 17 are views showing manufacturing processes of a semiconductor device according to the yet another embodiment of the present invention. FIGS. 13A, 14A, 15A, and 16A are plane views thereof and FIGS. 13B, 14B, 15B, and 16B, and FIG. 17 are front views thereof. The same reference numerals and symbols are used in these drawings to designate the same and corresponding portions, and the same reference numerals and symbols are used to designate portions the same as and corresponding to those previously explained. Hereinafter, explanation will be given avoiding repeated description.

Figure 13A:
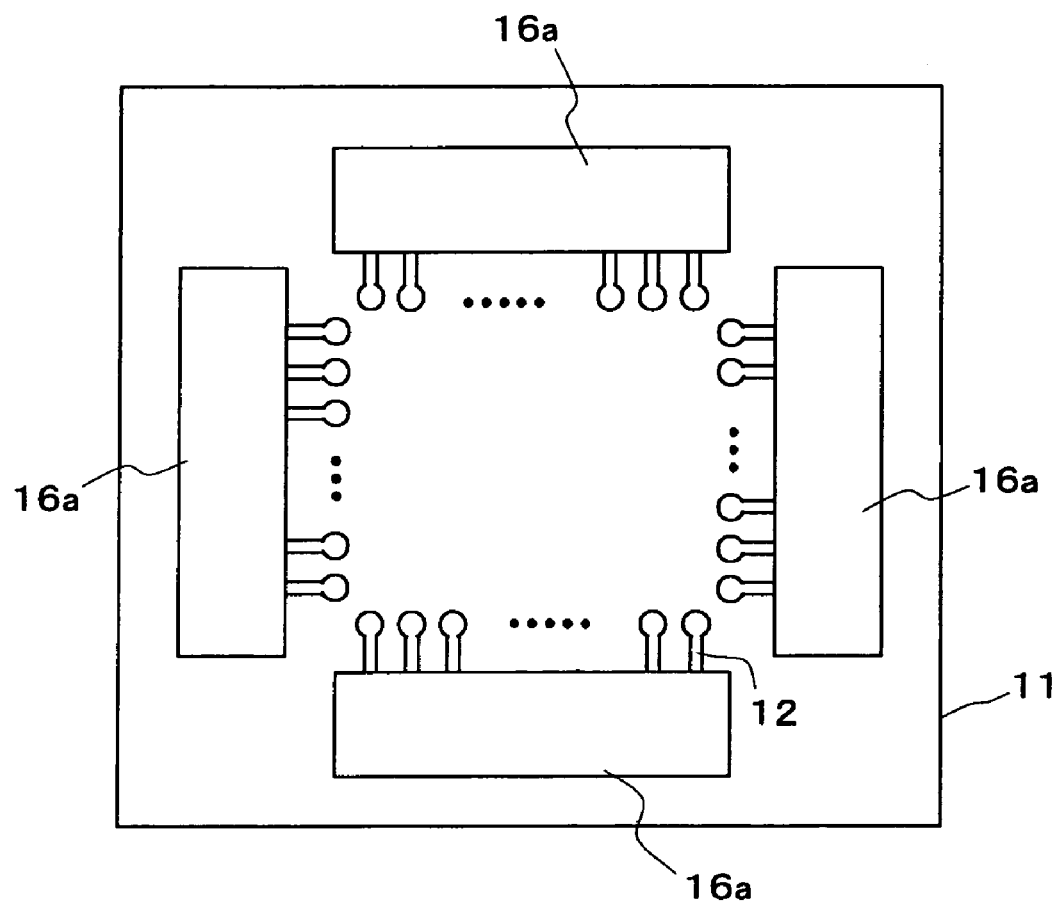
FIG. 13A and FIG. 13B are views showing a manufacturing process of a semiconductor device according to yet another embodiment of the present invention.
Figure 13B:
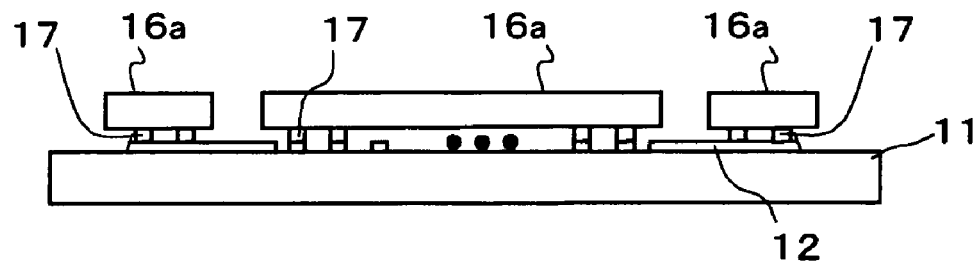

In this embodiment, the procedure of the flipchip connection of a semiconductor chip and capacitor chips is reversed, in other words, the capacitor chips are connected to a wiring board first. First, as shown in FIG. 13A and FIG. 13B, capacitor chips 16a are flipchip-mounted to face respective sides of the position in which the semiconductor chip is to be mounted. The capacitor chips 16a have gold projected electrodes 17 formed in advance on terminals (pads) thereon for use in flipchip-mounting the capacitor chips 16a.

Figure 14A:
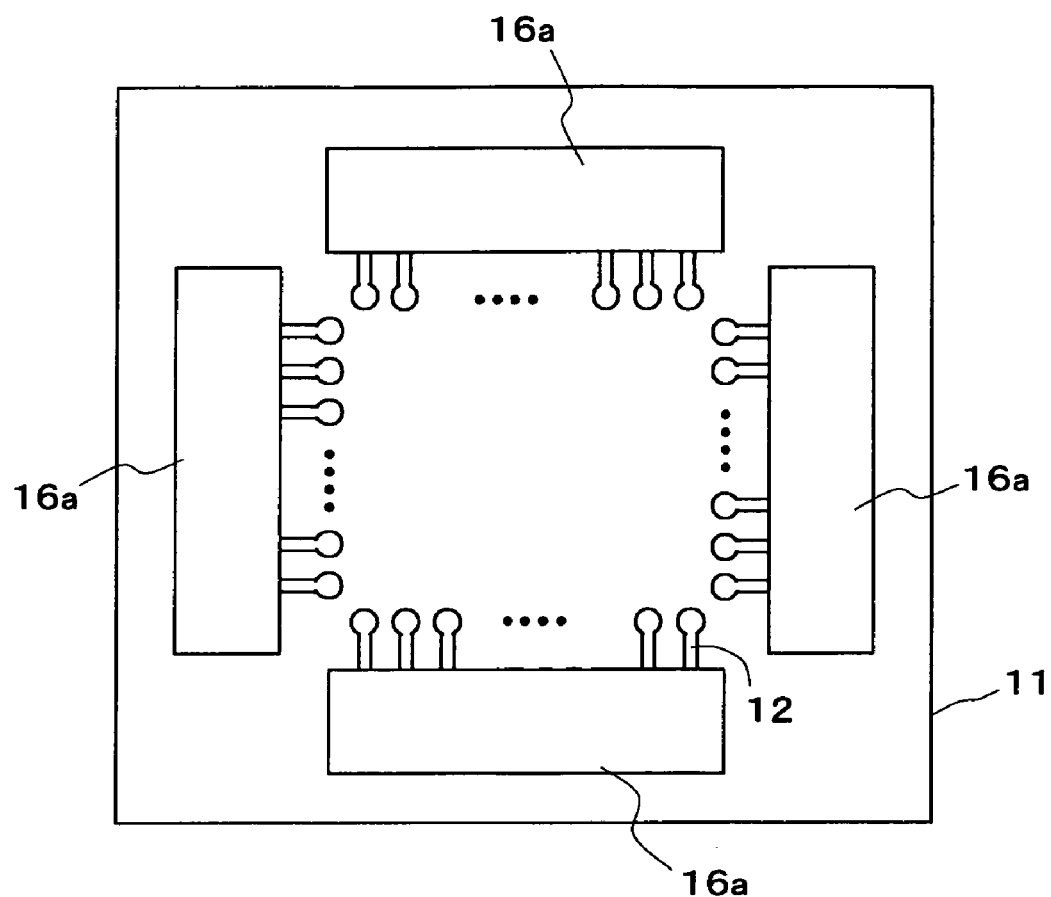
FIG. 14A and FIG. 14B are views subsequent to FIG. 13A and FIG. 13B, showing a manufacturing process of the semiconductor device according to the yet another embodiment of the present invention.
Figure 14B:
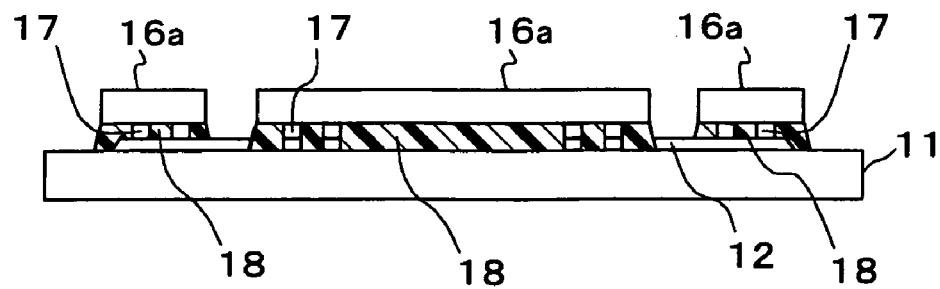

Next, as shown in FIG. 14A and FIG. 14B, a gap between a wiring board 11 and the capacitor chips 16a is filled with an underfill resin 18 in order to shield and protect the bonded portions from the atmosphere. A capillary action through the use of the underfill resin 18 in liquid form can be utilized to fill the gap. After filling the gap, the underfill resin 18 is cured by, for example, heating.

Note that the structure shown in FIG. 14A and FIG. 14B can be used as a semiconductor package member. In other words, the kind of semiconductor chips to be mounted thereon is exchangeable, and after only the positions of power source terminals and ground terminals of semiconductor chips are determined in advance, this structure can be used for general purposes appropriately according to the semiconductor chips.

Figure 15A:
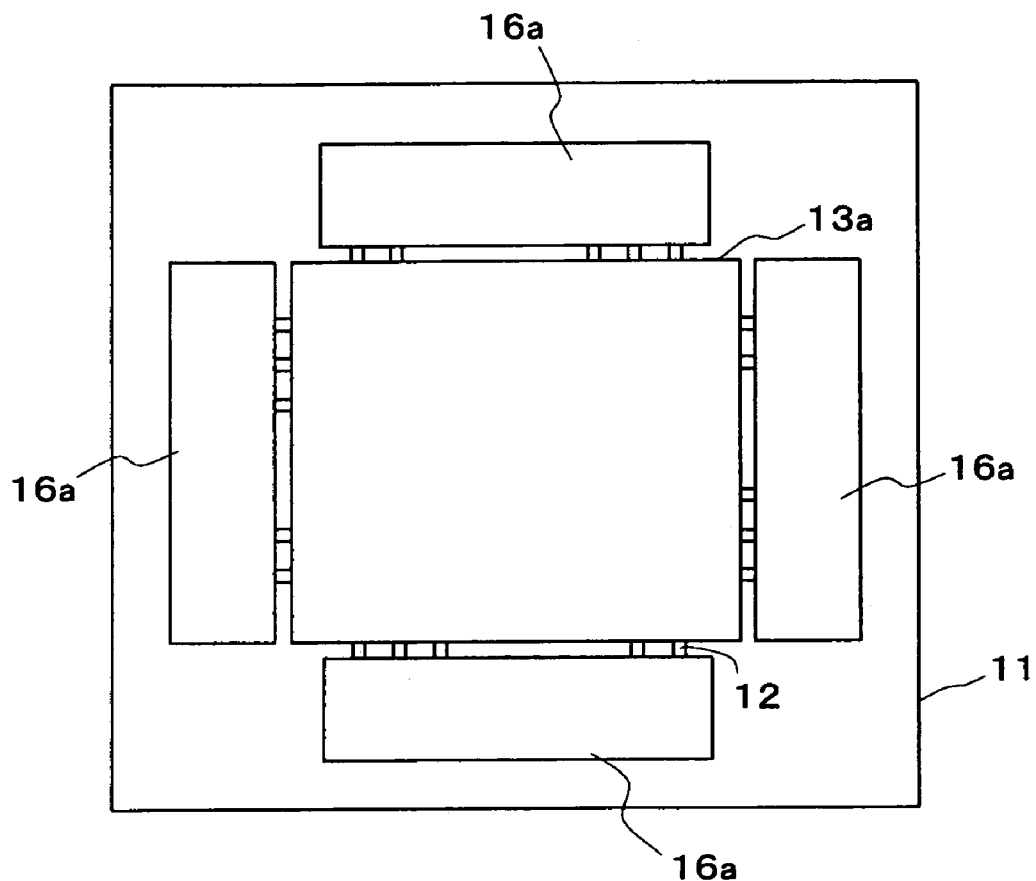
FIG. 15A and FIG. 15B are views subsequent to FIG. 14A and FIG. 14B, showing a manufacturing process of the semiconductor device according to the yet another embodiment of the present invention.
Figure 15B:
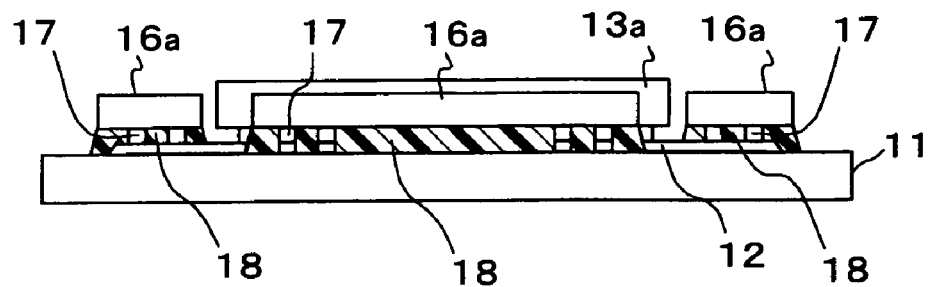

When the capacitor chips 16a are flipchip-connected onto the wiring board 11, the semiconductor chip 13a is subsequently flipchip-mounted on the wiring board 11, as shown in FIG. 15A and FIG. 15B. The semiconductor chip 13a has gold projected electrodes formed in advance on terminals (pads) thereon for use in flipchip-mounting the semiconductor chip 13a. The semiconductor chip 13a having the projected electrodes formed thereon is bonded to the wiring board 11 after being aligned with lands on the wiring board 11.

Figure 16A:
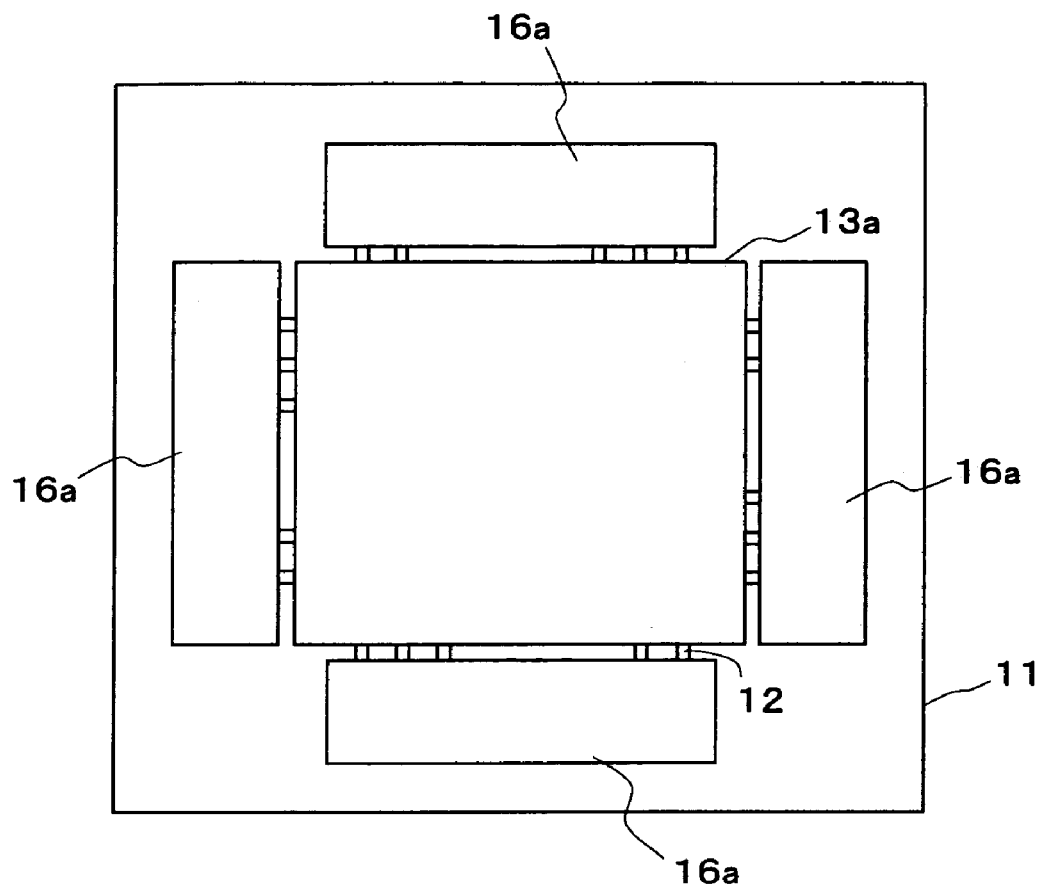
FIG. 16A and FIG. 16B are views subsequent to FIG. 15A and FIG. 15B, showing a manufacturing process of the semiconductor device according to the yet another embodiment of the present invention.
Figure 16B:
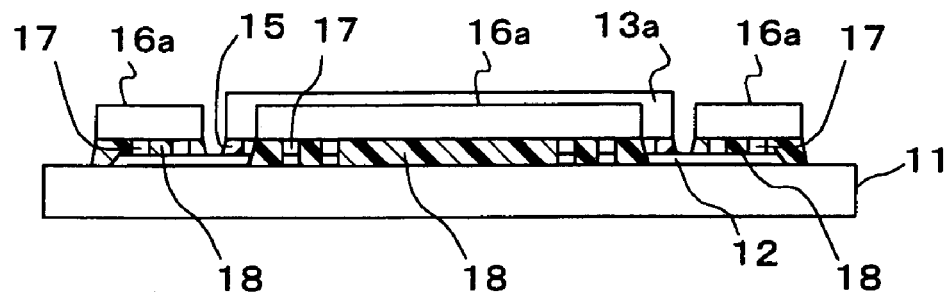

Next, as shown in FIG. 16A and FIG. 16B, a gap between the wiring board 11 and the semiconductor chip 13a is filled with an underfill resin 15 in order to shield and protect the bonded portions from the atmosphere. A capillary action through the use of the underfill resin 15 in liquid form can be utilized for filling the gap. After the gap is filled, the underfill resin 15 is cured by, for example, heating.

The semiconductor chip 13a is larger in height than the capacitor chips 16a in this embodiment. Therefore, it is convenient under such a condition that the capacitor chips 16a are flipchip-mounted first and the semiconductor chip 13a is flipchip-mounted thereafter. This is because a flipchip bonding tool for the semiconductor chip 13a can be also used for the capacitor chips 16a, which can reduce production facility cost. In this case, even when the flipchip bonding tool is used in common, the flipchip bonding tool is not interfered by the capacitor chips 16a at the time when the semiconductor chip 13a is flipchip-connected.

Needless to say, when the semiconductor chip 13a and the capacitor chips 16a are substantially the same in height, the use of a flipchip bonding tool exclusively for each of them prevents the semiconductor chip 13a or the capacitor chips 16a from interfering with the flipchip connection of the other, regardless of which flipchip connection comes first. Moreover, the exclusive use of the flipchip bonding tool makes it possible to determine the order of the flipchip connection irrespective of the height of these chips.

Figure 17:
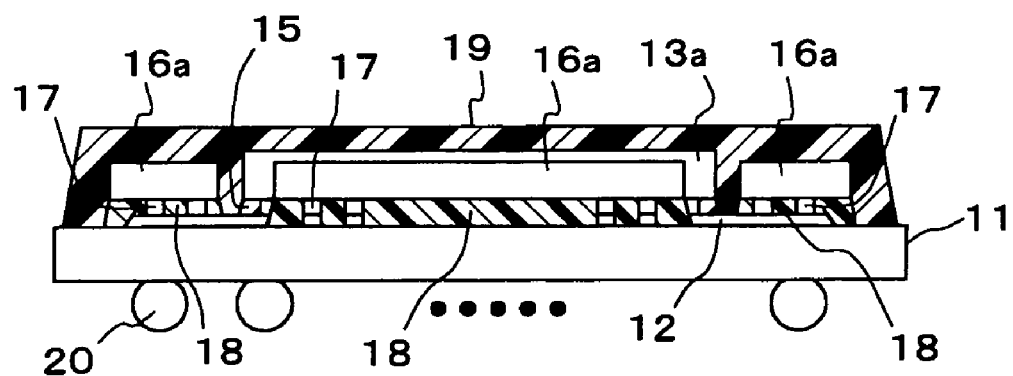
FIG. 17 is a view subsequent to FIG. 16A and FIG. 16B, showing a manufacturing process of the semiconductor device according to the yet another embodiment of the present invention.

When the underfill resin 15 is cured, a resin mold 19 is subsequently formed by, for example, transfer mold so as to cover the semiconductor chips 13a and the capacitor chips 16a in order to shield and protect the semiconductor chip 13a and the capacitor chips 16a, and solder balls 20 for external connection are attached to a rear face side of the wiring board 11, as shown in FIG. 17. Through these processes, the semiconductor device according to this embodiment is obtainable.

Also in this embodiment, the conventional surface-mounted capacitors are not necessary, nor is it necessary to provide a large number of power source terminals (pads) or ground terminals (pads) on the semiconductor chip 13a only for the purpose of reducing an electric current per terminal, which makes it possible to downsize the semiconductor device. Moreover, not only the integration of only the capacitors in the capacitor chips 16a is possible but also the integration of the resistors and inductors (only) in the capacitor chips 16a is possible, and in such cases, the resultant semiconductor devices are made suitable for the high-frequency operation similarly to the embodiments previously described.

Figure 18A:
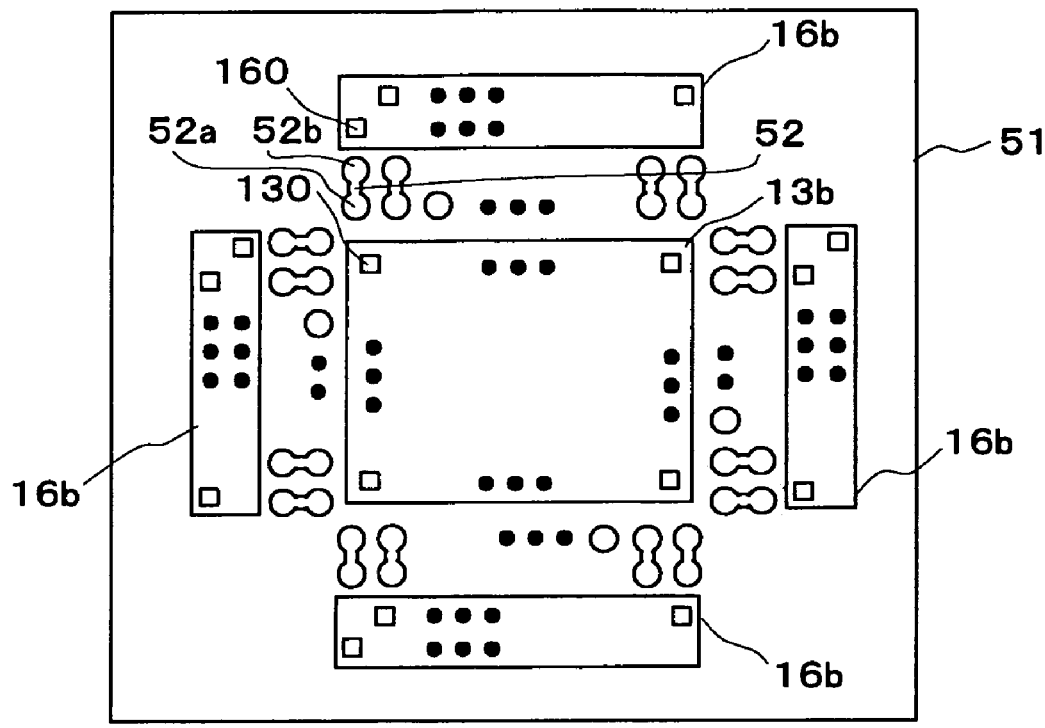
FIG. 18A and FIG. 18B are views showing a manufacturing process of a semiconductor device according to yet another embodiment of the present invention.
Figure 18B:
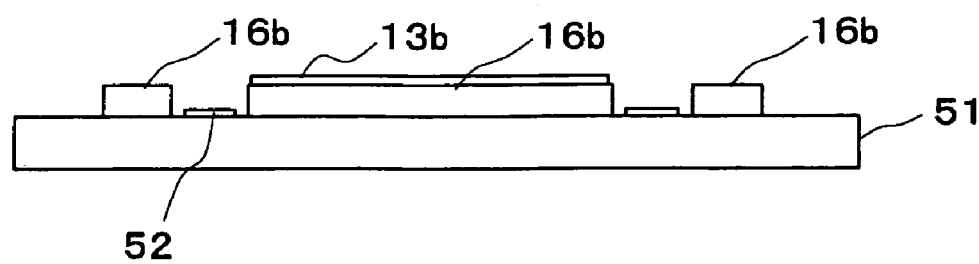

Next, yet another embodiment of the present invention will be explained with reference to FIG. 18A, FIG. 18B, FIG. 19A, and FIG. 19B. FIG. 18A, FIG. 18B, FIG. 19A, and FIG. 19B are views showing manufacturing processes of a semiconductor device according to the yet another embodiment of the present invention. FIG. 18A is a plane view, FIG. 18B is a front view, and FIG. 19A and FIG. 19B, which are views subsequent to FIG. 18A and FIG. 18B, are front views. In these drawings, the same reference numerals and symbols are used to designate the same and corresponding portions, and the same reference numerals and symbols are used to designate portions the same as or corresponding to those previously explained. The following explanation will be given avoiding repeated description.

In this embodiment, a semiconductor chip 13b and capacitor chips 16b are electrically connected to a wiring board 51 not by the flipchip connection but with bonding wires.

Specifically, as shown in FIG. 18A and FIG. 18B, the semiconductor chip 13b and the capacitor chips 16b are first arranged and fixed at predetermined positions on the wiring board 51 with functional surfaces thereof facing upward. In order to fix them, for example, well-known adhesive resin is usable as an adhesive layer.

Wiring patterns 52 are formed on the wiring board 51, and the wiring patters 52 include lands 52a for use in the bonding wire connection to the semiconductor chip 13b and lands 52b for use in the bonding wire connection to the auxiliary semiconductor chips (capacitor chips) 16b. Note that the wiring patterns 52 are also connected to inter-wiring-layer connectors (not shown) for electrical conduction in a direction passing through the wiring board 51.

Terminals (pads) 130 are formed on the semiconductor chip 13b along the periphery thereof. Further, a plurality of terminals (pads) 160 are formed on the capacitor chips 16b.

Figure 19A:
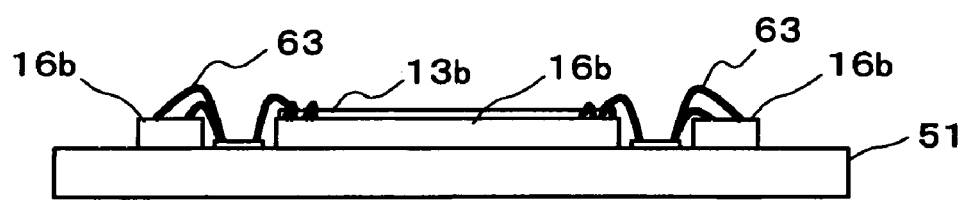
FIG. 19A and FIG. 19B are views subsequent to FIG. 18A and FIG. 18B, showing a manufacturing process of the semiconductor device according to the yet another embodiment of the present invention.

Next, as shown in FIG. 19A, the pads 130 on the semiconductor chip 13b and the lands 52a on the wiring board 51 are connected to each other by bonding wires 63. Similarly, the pads 160 on the capacitor chips 16b and the lands 52b on the wiring board 51 are connected to each other by bonding wires 63. Such bonding connection can be performed by a well-known method using a bonding tool.

Figure 19B:
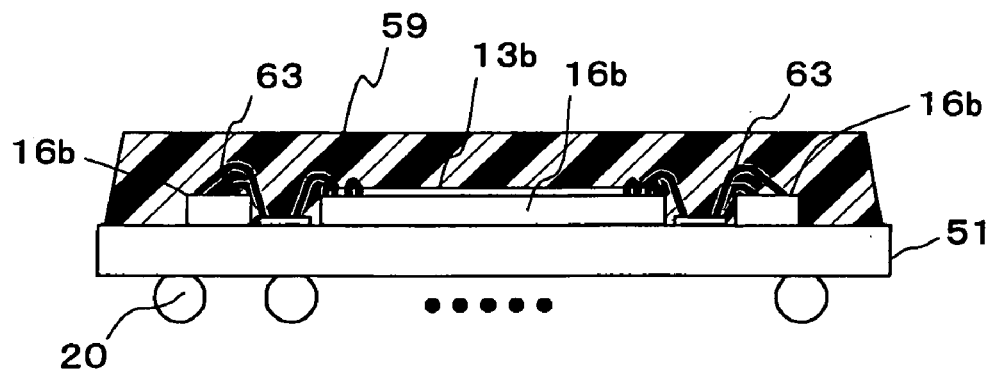

Next, as shown in FIG. 19B, a resin mold 59 is formed by, for example, transfer mold so as to cover the semiconductor chip 13b and the capacitor chips 16b for the purpose of the protection thereof, and solder balls 20 for external connection are attached to a rear face side of the wiring board 51. Through these processes, the semiconductor device of this embodiment is obtainable.

Also in the semiconductor device in this embodiment, capacitors are integrated in the capacitor chips 16b, and both ends of the capacitors are connected to the pads for external connection. The semiconductor chip 13b and the capacitor chips 16b are the same in that they are semiconductor chips, and that the arrangement pitches of pads (pads for external connection) provided thereon can be made at least substantially the same order. Therefore, it is possible to dispose the capacitor chips 16b adjacent to positions facing respective sides of the semiconductor chip 13b. This similarly enables the capacitors integrated in the capacitor chips 16b to function as bypass capacitors at positions very close to the semiconductor chip 13b.

Therefore, the conventional surface-mounted capacitors are not necessary, nor is it necessary to provide a large number of power supply terminals (pads) or ground terminals (pads) on the semiconductor chip 13b only for the purpose of reducing an electric current per terminal, which can downsize the semiconductor device. Moreover, this structure is based on the wire bonding technique which is easier than the flipchip connection, so that cost reduction can be expected. Further, not only the integration of only capacitors in the capacitor chips 16b is possible but also the integration of resistors and inductors (only) is possible, and in such cases, the resultant semiconductor device is made suitable for the high-frequency operation similarly to the embodiments previously described.

Figure 20A:
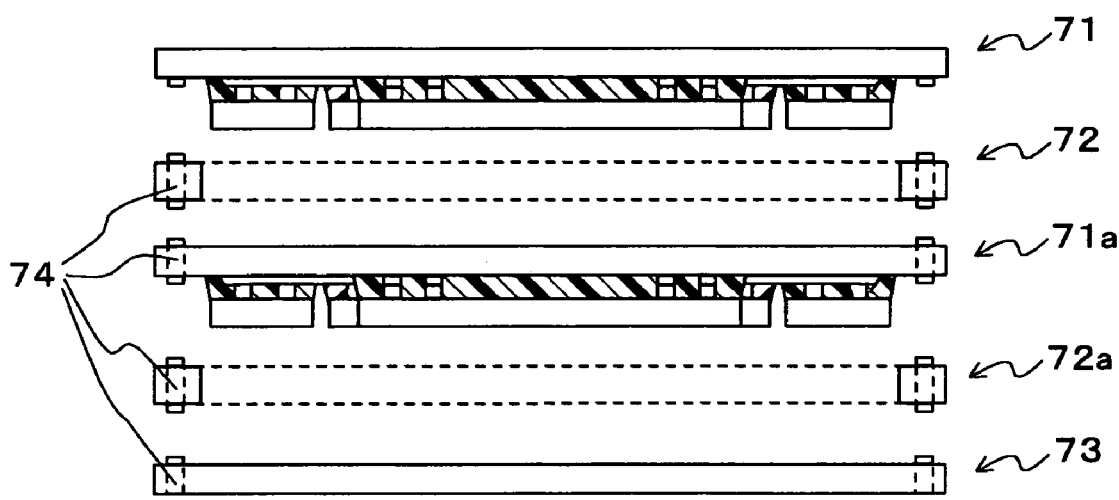
FIG. 20A and FIG. 20B are views showing the structure of a semiconductor device according to yet another embodiment of the present invention.
Figure 20B:
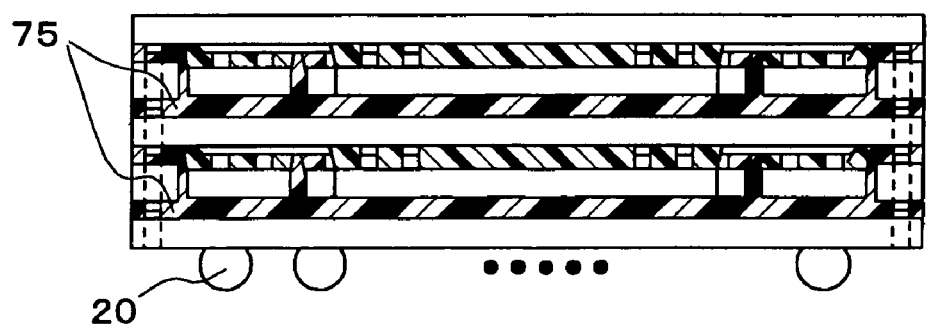
Figure 21A:
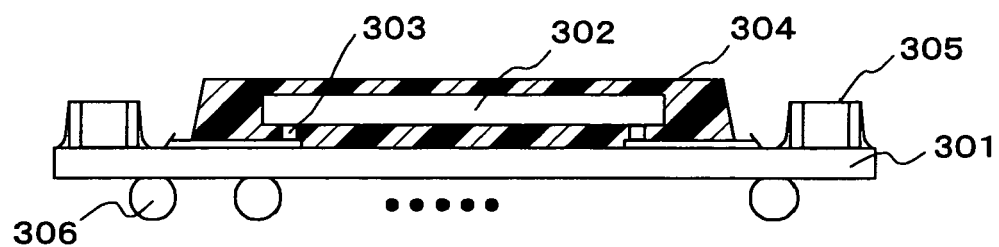
FIG. 21A and FIG. 21B are views showing a structure example of a conventional semiconductor device.
Figure 21B:
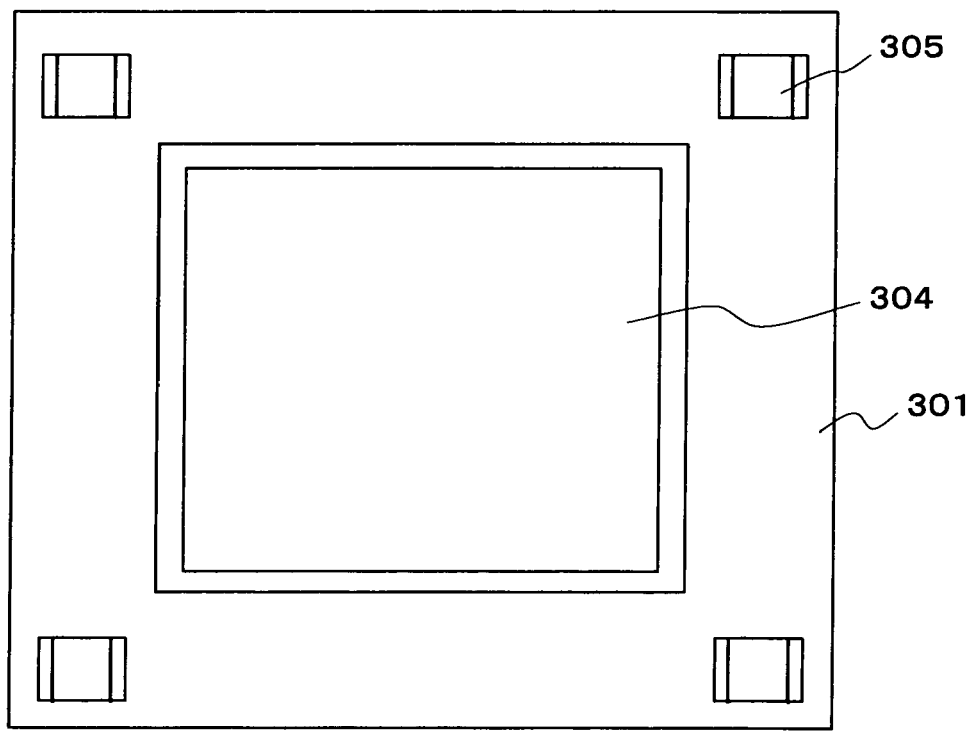
Figure 22:
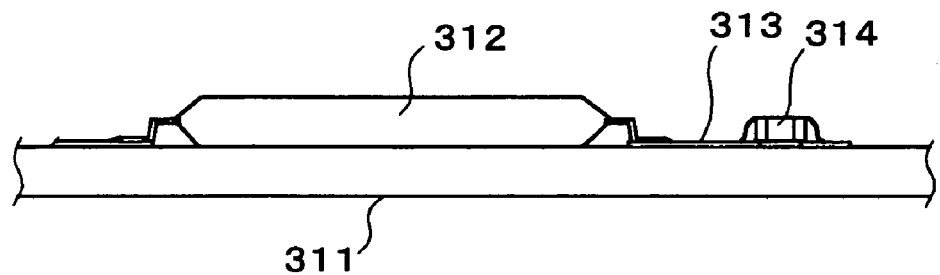
FIG. 22 is a view showing a structure example of another conventional semiconductor device.

Next, yet another embodiment of the present invention will be explained with reference to FIG. 20A and FIG. 20B. FIG. 20A and FIG. 20B are views showing the structure of a semiconductor device according to the yet another embodiment of the present invention. FIG. 20A is an exploded view thereof and FIG. 20B is a final view. In this embodiment, three-dimensional assembly based on the semiconductor devices according to the aforesaid embodiments results in a semiconductor device with higher function and higher integration.

In FIG. 20A, parts denoted by the reference symbols 71, 71a have gone through substantially the same processes as the processes that the workpiece shown in FIG. 5A and FIG. 5B or FIG. 16A and FIG. 16B has gone through. Here, the semiconductor chips 13 (13a) and the capacitor chips 16 (16a) are made substantially the same in height for the purpose of higher space utilization efficiency in the three-dimensional assembly. Further, the height of the semiconductor chips 13 (13a) and the capacitor chips 16 (16a) themselves is made as low as possible.

Generally, a semiconductor chip has a thickness (height) of about several hundreds μm, but when it is made as thin as possible while the mechanical strength is being kept, the thickness (height) thereof can be reduced to about 60 μm or less (for example, 50 μm). The thickness can be thus reduced in a semiconductor wafer having subjected to semiconductor manufacturing processes by, for example, polishing or grinding the rear face thereof. When a trench is dug along a dicing line before the semiconductor wafer is thus polished, dicing can be conducted synchronously with the aforesaid polishing.

Parts denoted by the reference symbols 72, 72a are substrates functioning as spacers and have a frame shape. A part denoted by the reference numeral 73 is a substrate which directly faces a different substrate when the assembled semiconductor substrates are mounted on the different substrate. The reference numeral 74 denotes inter-wiring-layer connectors provided to pass through the substrates 72, 72a, 73, and the part 71a. These inter-wiring-layer connectors are electrically connected to wiring layers on both surfaces of the substrates as shown in the drawing.

The parts arranged as shown in FIG. 20A are assembled as shown in FIG. 20B. Here, the aforesaid inter-wiring-layer connectors establish conduction by connecting the wiring layers (they become a vertical wiring portion as a whole). Such connection between the wiring layers can be realized by, for example, the reflow of cream solder which is applied on necessary portions of the wiring layers in advance.

Then, the solder balls 20 are attached onto the substrate 73 and gaps reserved by the substrates 72, 72a are filled with filler resin 75. Through these processes, the semiconductor device according to this embodiment is obtainable. Here, the thickness of the wiring boards used for the parts 71, 71a can be made, for example, about 50 μm. Therefore, a semiconductor device whose total thickness is very thin is obtainable in spite of the three-dimensional assembly.

Though the semiconductor device using a two-layered semiconductor chips is explained as an example, it is possible to stack and assemble several chips (for example, four layers and five layers). Even in the case of, for example, the five-layered assembly, the total thickness can be 2 mm or less (excluding the solder balls 20). In this embodiment, downsizing (thinning) in semiconductor devices having the three-dimensional structure can be realized.

It is to be understood that the present invention is not intended to be limited to the specific embodiments which are described here with reference to the drawings, and all the changes without departing from the following claims are also considered to be included in the present invention.

What is claimed is:

1. A semiconductor device, comprising:
   a wiring board;
   a semiconductor chip provided on said wiring board and having a pad electrically connected to a wiring on said wiring board; and
   a second semiconductor chip, provided on said wiring board, having a semiconductor substrate with a side facing a side of said semiconductor chip, having a plurality of passive elements integrated on said semiconductor substrate, and having a plurality of pads for external connection to which both ends of each of said plurality of passive elements are electrically connected respectively, at least one of said both ends of at least one of said plurality of passive elements is electrically connected via at least one of said plurality of pads for external connection to said wiring on said wiring board electrically connected to said pad of said semiconductor chip.

2. A semiconductor device as set forth in claim 1, wherein said plurality of passive elements integrated on said semiconductor substrate are elements of one kind, or two kinds or more selected from a group of a capacitor, a resistor, and an inductor.

3. A semiconductor device as set forth in claim 1, wherein said semiconductor chip is flipchip-connected to said wiring board so as to electrically connect said pad thereof to said wiring on said wiring board.

4. A semiconductor device as set forth in claim 1, wherein said semiconductor chip has bonding wire connection to said wiring of said wiring board so as to electrically connect said pad thereof to said wiring on said wiring board.

5. A semiconductor device as set forth in claim 1, wherein said second semiconductor chip is flipchip-connected to said wiring board.

6. A semiconductor device as set forth in claim 5, wherein said second semiconductor chip has at least some of said plurality of pads for external connection used for said flipchip connection to said wiring board and at least some of said plurality of pads for external connection not contributing to said flipchip connection to said wiring board.

7. A semiconductor device as set forth in claim 1, wherein said second semiconductor chip has bonding wire connection to said wiring of said wiring board.

8. A semiconductor device as set forth in claim 1, wherein said semiconductor chip and said second semiconductor chip are both 60 μm or less in thickness.

9. A semiconductor device as set forth in claim 1, wherein via said wiring on said wiring board said at least one of said plurality of pads for external connection of said at least one of said both ends of said at least one of said plurality of passive elements is positioned to be adjacent to said pad of said semiconductor chip.

10. A semiconductor device, comprising:
a plurality of semiconductor device portion units arranged in a lamination direction and each including: a wiring board; a semiconductor chip provided on said wiring board; a pad electrically connected to a wiring on said wiring board; and a second semiconductor chip, provided on said wiring board, having a semiconductor substrate with a side facing a side of said semiconductor chip, having a plurality of passive elements integrated on said semiconductor substrate, and having a plurality of pads for external connection to which both ends of each of said plurality of passive elements are electrically connected respectively, at least one of said both ends of at least one of said plurality of passive elements is electrically connected via at least one of said plurality of pads for external connection to said wiring on said wiring board electrically connected to said pad of said semiconductor chip; and
a vertical wiring portion passing through said wiring boards of said plurality of semiconductor device portion units and electrically connecting said wiring boards to one another.

11. A semiconductor device as set forth in claim 10, wherein said plurality of passive elements integrated on said semiconductor substrates of the respective plurality of semiconductor device portion units are elements of one kind, or two kinds or more selected from a group of a capacitor, a resistor, and an inductor.

12. A semiconductor device as set forth in claim 10, wherein in each of said plurality of semiconductor device portion units, via said wiring on said wiring board, said at least one of said plurality of pads for external connection of said at least one of said both ends of said at least one of said plurality of passive elements is positioned to be adjacent to said pad of said semiconductor chip.

13. A semiconductor package member, comprising:
a wiring board on which a semiconductor chip is mountable; and
an auxiliary semiconductor chip, provided on said wiring board, having a semiconductor substrate with a side facing a side of said semiconductor chip to be mounted, having a plurality of passive elements integrated on said semiconductor substrate, and having a plurality of pads for external connection to which both ends of each of said plurality of passive elements are electrically connected respectively, at least one of said both ends of at least one of said plurality of passive elements is electrically connected via at least one of said plurality of pads for external connection to a wiring on said wiring board.

14. A semiconductor package member as set forth in claim 13, wherein said plurality of passive elements integrated on said semiconductor substrate are elements of one kind, or two kinds or more selected from a group of a capacitor, a resistor, and an inductor.

15. A semiconductor package member as set forth in claim 13, wherein said at least one of said plurality of pads for external connection of said at least one of said both ends of said at least one of said plurality of passive elements is positioned to be adjacent to a pad of said semiconductor chip to be mounted, said pad for connecting to said wiring on said wiring board.

* * * * *